United States Patent [19]

Koleske et al.

[11] Patent Number: 4,977,199

[45] Date of Patent: Dec. 11, 1990

[54] PHOTO CURABLE BLENDS OF 2-METHYOXYTETRAHYDROPYRAN AND A CYCLOALIPHATIC DIEPOXIDE

[75] Inventors: Joseph V. Koleske, Charleston, W. Va.; George T. Kwiatkowski, Green Brook, N.J.

[73] Assignee: Union Carbide Chemicals and Plastics Company Inc., Danbury, Conn.

[21] Appl. No.: 298,244

[22] Filed: Jan. 13, 1989

Related U.S. Application Data

[63] Continuation of Ser. No. 901,586, Aug. 29, 1986, abandoned, which is a continuation-in-part of Ser. No. 480,299, May 29, 1983, abandoned.

[51] Int. Cl.$^5$ .................... C08G 59/24; C08G 63/08; C08J 3/28; C08K 5/15
[52] U.S. Cl. ................................ 522/31; 522/170; 528/361; 528/393; 528/406; 528/417
[58] Field of Search ................. 522/31, 170; 528/417, 528/361

[56] References Cited

U.S. PATENT DOCUMENTS

| Re. 28,715 | 2/1976 | Stamberger . |
| Re. 29,014 | 10/1976 | Pizzini et al. . |
| Re. 29,118 | 1/1977 | Stamberger . |
| 2,750,395 | 6/1956 | Phillips et al. . |
| 2,890,194 | 6/1959 | Phillips et al. . |
| 3,073,788 | 1/1963 | Hostettler et al. . |
| 3,169,945 | 2/1965 | Hostettler et al. . |
| 3,242,104 | 3/1966 | Brueschweiler ............. 528/417 |
| 3,311,573 | 3/1967 | Graham et al. . |
| 3,311,574 | 3/1967 | Bowering et al. . |
| 3,311,575 | 3/1967 | Graham et al. . |
| 3,318,822 | 5/1967 | Batzer et al. . |
| 3,379,653 | 4/1968 | Ernst et al. . |
| 3,586,616 | 6/1971 | Kropp . |
| 3,652,639 | 3/1972 | Pizzini et al. . |
| 3,708,296 | 1/1973 | Schlesinger . |
| 3,794,576 | 2/1974 | Watt . |
| 3,816,279 | 6/1974 | Schlesinger ................. 522/170 |
| 3,835,003 | 10/1974 | Schlesinger ................. 522/170 |
| 3,893,985 | 7/1975 | Papa et al. . |
| 3,897,255 | 7/1975 | Erickson . |
| 3,950,317 | 4/1976 | Patton, Jr. et al. . |
| 4,007,209 | 2/1977 | Hickman et al. . |
| 4,058,400 | 11/1977 | Crivello . |
| 4,069,054 | 1/1978 | Smith . |
| 4,069,055 | 1/1978 | Crivello . |
| 4,086,091 | 4/1978 | Cella . |
| 4,104,236 | 8/1978 | Simroth . |
| 4,139,655 | 2/1979 | Tsao . |
| 4,161,478 | 7/1979 | Crivello . |
| 4,172,825 | 10/1979 | Shook et al. . |
| 4,198,488 | 4/1980 | Drake et al. . |
| 4,208,314 | 6/1980 | Priest et al. . |
| 4,231,951 | 11/1980 | Smith et al. . |
| 4,256,828 | 3/1981 | Smith . |
| 4,294,746 | 10/1981 | Blair et al. ............. 525/107 |
| 4,299,938 | 11/1981 | Green et al. . |
| 4,321,351 | 3/1982 | Zuppinger ............. 528/361 |
| 4,371,713 | 2/1983 | Matsumoto ............. 528/408 |
| 4,383,025 | 5/1983 | Green et al. . |

FOREIGN PATENT DOCUMENTS

| 0109851 | 5/1984 | European Pat. Off. . |
| 0123912 | 7/1984 | European Pat. Off. . |
| 44945 | 7/1966 | German Democratic Rep. . |
| 8501947 | 5/1985 | PCT Int'l Appl. . |
| 1091463 | 11/1967 | United Kingdom . |
| 2073760 | 10/1981 | United Kingdom . |

OTHER PUBLICATIONS

"Photopolymerization . . . Coatings" Roffey, John Wiley & Sons, Jun. 1982, pp. 74–79.
Omichi, "Synthesis"–Chemical Abstracts, vol. 83, No. 29, Sep. 15, 1975, Abstract No. 97580p.
Visnapuu, "Mastic"–Chemical Abstracts, vol. 86, No. 42, Apr. 18, 1977, Abst. No. 108200e.
Satyamurthy, "Synthesis"–Chemical Abstracts, vol. 101, Sep. 24, 1984, Abst. No. 110702s.
Crivello et al., "New Monomers for Cationic UV-Curing" Conference Proceedings, Radiation Curing VI, pp. 4–28, Sep. 2023, 1982 (Assoc. for Finishing Processes of SME).
Crivello and Lam "Photoinitiator Cationic Polymerization by Diarylchloronium Salts"–Journal of Polymer Science, Polymer Letters Edition, vol. 16, pp. 563–571 (1978).
Chemical Abstract, vol. 89, Nov. 26, 1978, Abstract #216123c (Minakova et al.).
Journal of Polymer Science, Chemical Edition–vol. 16, pp. 2441–51 (Crivello and Lam).
Journal of Polymer Science, Chemical Edition–vol. 17, pp. 1059–65 (Crivello and Lam).
Chemical Abstracts, vol. 91, No. 4, p. 5, 21201k, Crivello.

Primary Examiner—Marion C. McCamish
Assistant Examiner—Arthur H. Koeckert
Attorney, Agent, or Firm—Jean B. Mauro

[57] ABSTRACT

Photopolymerizable compositions, based on 2-methoxytetrahydropyran and 3,4-epoxycyclohexylmethyl-3,4-epoxycyclohexane carboxylate, which can be applied as coatings on substrates and photocured at high speeds.

10 Claims, No Drawings

PHOTO CURABLE BLENDS OF 2-METHYOXYTETRAHYDROPYRAN AND A CYCLOALIPHATIC DIEPOXIDE

BACKGROUND OF THE INVENTION

1. Field of the Invention

This application pertains generally to radiation curable and photocurable compositions. More specifically, this application pertains to compositions which are curable with ultraviolet light, using photoinitiators which form cationic catalysts.

2. Description of the Prior Art

It is well known that coatings play a useful role in the manufacture of a wide variety of useful articles. Until recently, nearly all coatings were formulated and applied by employment of an organic solvent, which often comprised a major portion of the total formulated coating. After the coating is applied to the article to be coated, the organic solvent is evaporated, leaving the dried coating on the article to serve its decorative or functional purpose. This coating system has met with increasing disfavor as the cost of energy needed to evaporate the solvent at the rate required by industry increased, as the price of the solvent increased, and as the deleterious environmental effects of the evaporated solvent became better understood. In addition, governmental regulations have placed ever increasing restrictions on the amounts and types of solvents or organic volatiles permitted to escape into the atmosphere from coatings' compositions. Systems aimed at solvent recovery to reduce pollution and conserve solvent have generally proven to be energy intensive and expensive.

Considerable efforts have been expended by those skilled in the art to develop coating compositions having a minimal amount of volatile organic components and this has led to development of powder coatings, radiation-curable coatings, water-borne coatings and high solids coatings. In these recent developments, the amounts of organic solvents present are minimal and consequently there is little or no atmospheric pollution.

Among the new coating systems, radiation-curable coatings, usually cured with ultraviolet light or electron beam radiation, offer a variety of advantages. They require only minimal energy to effect cure (change from liquid to solid state), they do not contain volatile solvents, and thus do not cause deleterious effects to the environment, and they are cost effective, since essentially all of the applied liquid is converted to a solid coating.

An important disadvantage of photocurable systems is the frequent requirement that the curing process be conducted in an inert atmosphere because of the inhibiting effect of oxygen. Also, most photocurable systems based on acrylates are irritating to the skin and eyes of workers using them and can cause sensitization of those who are exposed to the systems.

Responding to such problems, those skilled in the art have devised photocurable coatings which cure through a mechanism termed cationic polymerization. In these systems, the starting materials are mixed with catalysts which form acids when exposed to ultraviolet light; the starting materials are therefore polymerized via cationic catalysis.

Epoxy resins, linear vinyl ethers, and cyclic vinyl ethers have been shown to be suitable starting materials for photocure via cationic polymerization, as disclosed in, for example, U.S. Pat. No. 3,794,576; the publication of Crivello et al., "New Monomers for Cationic UV-Curing", Conference Proceedings, Radiation Curing VI, pages 4-28, Sept. 20-23, 1982 (Association for Finishing Processes of SME); and British publication GB 2,073,760A.

Crivello et al. reported that diaryliodonium and triasylsulfonium salts could be used in relatively low concentrations as photoinitiators for UV curable coatings based upon multifunctional linear vinyl ether monomers. The cationic copolymerization of such vinyl ethers with epoxy monomers is also reported.

Although mixtures of cycloaliphatic epoxides and cyclic vinyl ethers are considered to be rapid curing in nature, with curing line speeds of 30 to 60 feet/minute readily attainable when a single light source is used, even further increases in curing speed are desirable to provide more productive, efficient and cost-effective industrial coating processes.

In contrast to the cyclic vinyl ethers and cyclic epoxides, cycloaliphatic ethers have been reported as slow in polymerizing under cationic photocuring conditions. See, e.g., Crivello and Lam, "Photoinitiator Cationic Polymerization by Diarylchloronium and Diarylbromonium Salts," *Journal of Polymer Science*, Polymer Letters Edition, Vol. 16, pp. 563-571 (1978), in which the polymerization of tetrahydrofuran when exposed to ultraviolet light in the presence of a photoinitiator was reported as very slow, particularly in contrast to the polymerization of the epoxide cyclohexene oxide.

Similarly, the applicants have observed that when a substituted cycloaliphatic ether such as 2-methoxytetrahydropyran alone is combined with an onium salt photoinitiator and exposed to ultraviolet light, only slow polymerization takes place.

SUMMARY OF THE INVENTION

Surprisingly, it has been discovered that when a cycloaliphatic ether is added to a composition comprising a cycloaliphatic epoxide which is suitable for photopolymerization, the rate of curing in the presence of ultraviolet light and a photoinitiator which produces a cationic catalyst is increased by at least an order of magnitude compared to that of a similar composition without the added cycloaliphatic ether.

It has further been discovered that such enhanced reaction rates can be produced with reduced amounts of the photoinitiator, producing cost savings of commercial significance due to reduced consumption of the relatively expensive compounds customarily used.

In accordance with the present invention, a composition suitable for photopolymerization is provided which comprises at least one cyclic ether-containing compound and at least one cycloaliphatic epoxide containing at least one epoxy group, wherein the cyclic ether and the epoxy group(s) are contained in the same or different molecules. The cyclic ether can be cycloaliphatic, including oxacycloalkanes and oxacycloolefins, and preferably contains at least one substituent selected from the group consisting of alkyl, alkoxy, hydroxyalkyl, vinyl, substituted and unsubstituted aryl, nitro, sulfonyl, hydroxyalkyl groups reacted with oxyalkylene adducts, carboxylic acids or lactones, and halide groups. Most preferably, when substitutents are present, at least one substitutent is located adjacent to the ether linkage of the cycloaliphatic ether. Completely saturated cyclic ethers or oxacycloalkanes (free of cyclic ethylenic unsaturation) are particularly preferred.

In another embodiment of the present invention, the photopolymerizable composition includes at least one additional ingredient selected from poly (active hydrogen) organic compounds (such as, for example, a polyol), cyclic and linear vinyl ethers, glycidyl ethers, poly(vinyl halides) such as poly(vinyl chlorides), poly(vinyl esters) such as poly(vinyl acetates), polylactones such as polycaprolactones, aryl-alkyl alcohol copolymers such as styrene-allyl alcohol copolymer; cellulosic polymers such as cellulose acetate, cellulose acetate butyrate, ethyl cellulose and the like and copolymers of vinyl halides and vinyl esters, glycidyl acrylates, hydroxyalkyl acrylates, and mixtures of such monomers.

In a preferred embodiment, the photopolymerizable composition also contains a photoinitiator which forms a cationic catalyst when irradiated in solution, preferably selected from the group consisting of diazonium salts, onium salts, and mixtures thereof.

Further, in accordance with the present invention, processes are provided for photopolymerizing the claimed compositions, preferably using a reduced amount of photoinitiator which is effective to produce a cure rate greater than that of a composition not containing the cyclic ether-containing compound.

Still further in accordance with the present invention, radiation-cured coatings are provided which are prepared in accordance with the claimed processes and from the claimed photopolymerizable compositions.

Further aspects and advantages of the present invention will be apparent from perusal of the following detailed description and the appended claims.

DETAILED DESCRIPTION OF THE INVENTION

The addition of cyclic ethers to photocurable compositions containing at least one cycloaliphatic epoxide has been found to result in photopolymerizable compositions which provide greatly increased cure rates even with the use of reduced amounts of photoinitiator.

Although the compositions in the examples of the present application have been cured by exposure to ultraviolet light, the improvements of the present invention can be obtained in systems which are cured by any type of electromagnetic radiation of a suitable energy level, provided an appropriate photoinitiator is present. Effective sources of radiation include, but are not limited to, gamma rays, X-rays, electron beams, ultraviolet light, and visible light. Thus, although the terms "photocuring", "photopolymerization" and the like are used in the present application to work done with ultraviolet light, they should be considered equivalent to radiation curing or polymerization in a general sense. The terms "photocopolymerizable" and "photocopolymerize" indicate that at least some of the components of the composition (the cycloaliphatic epoxide, optional monomers or polymeric components, and the cyclic ether) copolymerize when irradiated in the presence of a photoinitiator. While some components may be homopolymerized to some degree, it is presently believed that at least some copolymerization takes place, and it is presently preferred that copolymerization predominates, as the crosslinking provides more desirable properties in the cured coating.

The compositions of the present invention contain the cycloaliphatic epoxides as described below, optionally in combination with other monomers and polymeric components, and the cyclic ethers as described below. The photoinitiator can be added in the desired quantity at the time the composition is to be cured, or alternatively, can be included as part of the composition. It has been found that compositions of the present invention are surprisingly stable even when the photoinitiator is included, producing equivalent curing results after a year's storage.

The cyclic ether-containing compounds useful in the present invention comprise cyclic ethers alone as well as such ethers included in more complex ring structures, such as polycyclic or fused ring structures, polymeric structures or complex molecules. For example, a biscyclic ether can be prepared by coupling or condensing two molecules of a hydroxyalkyl cyclic ether with a dicarboxylic acid or anhydride such as phthalic anhydride to produce a structure such as shown in the formula below:

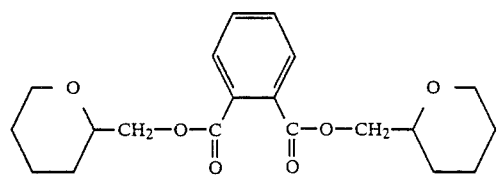

As apparent to those skilled in the art, the nature and size of the structure connecting the ether rings can be varied by choosing from various diacids capable of esterifying the hydroxyalkyl group, and using hydroxyalkyl substituents having from 1 to about 10 carbon atoms, for example. The cyclic ether structure itself can be saturated or unsaturated, substituted or unsubstituted, and preferably can have from 4 to about 10 ring carbon atoms. Although cyclic ethers which are part of more complex structures can be more effective in causing gelling or polymerization of the compositions during curing, presently it is preferred to use simple cyclic ethers due to commercial availability and the excellent results obtainable. The cyclic ether and other components should combine to produce a composition having a viscosity suitable for application as a coating or other desired product, but no component should be so volatile as to cause significant loss of ingredients from the composition during the preparation, shipment, storage, application or curing stages.

Preferably the cyclic ether structure contains from 4 to about 6 ring carbon atoms, and most preferably includes the five-carbon pyran ring structure.

The cyclic ethers can be saturated or unsaturated, e.g., containing at least one double bond adjacent to the ether linkage to form what are referred to as cyclic vinyl ethers. Suitable cyclic vinyl ethers including dihydropyranyl and di-(dihydropyranyl) compounds are disclosed in the parent U.S. patent application Ser. No. 480,299. Cyclic ethers with double bonds further removed from the ether linkage can also be used. The completely saturated cyclic ethers are presently preferred, particularly those including the tetrahydropyran ring, as higher cure rates of the compositions are obtained with equivalent amounts of photoinitiators.

The cyclic ethers can be either unsubstituted or substituted, but the presence of substituents has been found to provide improvements, such as lower volatility of the ether and faster cure rates. The substituents when present are preferably electron-withdrawing groups such as alkoxy, hydroxyalkyl, halide, nitro, vinyl substituted and unsubstituted aryl, sulfonyl and halide. Alkyl, aryl, vinyl alkoxy, and hydroxyalkyl groups having from 1 to about 10 carbon atoms can be used. Preferably, these groups contain from 1 to about 4 carbon atoms, and the methoxy group has been found to produce higher cure rates than groups with higher numbers of carbon atoms or hydroxyalkyl groups. Examples of suitable substituents in these categories include methyl, ethyl and propyl groups, phenyl and phenyl substituted with halides or alkyl groups having 1-3 carbons. Alkaryl and aralkyl groups having from 7 to about 12 carbon atoms can also be used. Other substituents which can be used include hydroxyalkyl groups —R—OH reacted with oxyalkylene adducts

such as ethylene or propylene oxide and the like, to form a substituent containing an ether linkage —R-(—O—$R_1$)$_m$OH, where m=1 to 10, hydroxyalkyl groups reacted with substituted or unsubstituted lactones

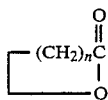

(with n=4-8) to form substituent groups containing an oxyester linkage

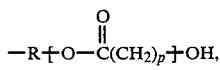

with p=1 to 10, and hydroxyalkyl groups reacted with an organic carboxylic acid $R_2$COOH to form substituent groups containig an ester linkage,

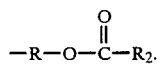

These compounds can be prepared as described on pages 12-14 of U.S. patent application Ser. No. 480,299. The substituents can be present in any position on the ether ring, but preferably at least one substituent occupies a carbon atom adjacent to the ether linkage. When unsaturation is present, at least one substituent is preferably separated from the double bond(s) by at least one C—C bond.

Of the tetrahydropyran compounds used in the examples of the present application, 2-methoxytetrahydropyran is presently preferred due to the high cure rates obtained in comparison with 2-hydroxymethyltetrahydropyran and unsubstituted tetrahydropyran.

The cyclic ethers described above can be used in any suitable proportion of the total composition which will produce the desired cure rate and properties in the finished coatings or other cured products. Generally, the cyclic ether should constitute from about 5 to about 60 weight percent of the entire composition, preferably from about 10 to about 50 weight percent, and most preferably from about 10 to about 35 weight percent. The cyclic ether can also be blended in proportion to the amount of the cycloaliphatic epoxide present so that it is generally present as from about 5 to about 70 weight percent, preferably from about 10 to about 50, and most preferably from about 15 to about 45 of the combined weights of the cyclic ether and cycloaliphatic epoxide.

The compositions of the present invention in which the cure rate is increased by the presence of the cyclic ethers described above include an epoxide. The epoxides which may be used herein contain at least one epoxy group having the formula:

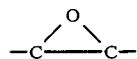

The epoxy groups can be terminal epoxy groups or internal epoxy groups. The epoxides are primarily cycloaliphatic epoxides, such as the compounds prepared by epoxidation of multicycloalkenyls (polycyclic aliphatic compounds containing carbon-carbon double bonds) with organic peracids (such as peracetic acid) or hydrogen peroxide. These cycloaliphatic epoxide resins may be blended with minor amounts of glycidyl type epoxides, aliphatic epoxides, epoxy cresol novolac resins, epoxy phenol novolac resins, polynuclear phenol-glycidyl ether-derived resins, aromatic and heterocyclic glycidyl amine resins, hydantoin epoxy resins, epoxides of natural oils such as soybean and linseed oils and the like, and mixtures thereof.

Preferred cycloaliphatic epoxide resins for purposes of this invention are those having an average of two or more epoxy groups per molecule. Illustrative of suitable cycloaliphatic epoxides are the following:

FORMULA 1

Diepoxides of cycloaliphatic esters of dicarboxylic acids having the formula:

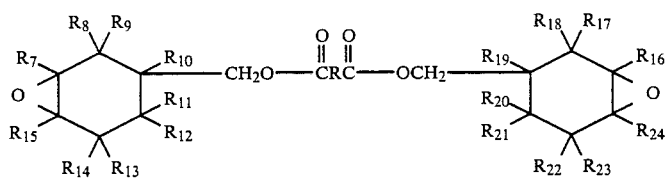

wherein $R_7$ through $R_{24}$ can be the same or different, are hydrogen or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl and the like; R is a valence bond or a divalent hydrocarbon radical generally containing one to twenty carbon atoms, inclusive, and preferably containing four to six carbon atoms, inclusive, as for example, alkylene radicals, such as trimethylene, tetramethylene, pentamethylene, hexamethylene, 2-ethylhexamethylene, octamethylene, nonamethylene, hexadecamethylene and the like; cycloaliphatic radicals, such as 1,4-cyclohexane, 1,3-cyclohexane, 1,2-cyclohexane, and the like.

Preferably the majority of $R_7$ through $R_{24}$ are hydrogen. Particularly desirable epoxides, falling within the scope of Formula 1, are those wherein $R_7$ through $R_{24}$ are all hydrogen and R is alkylene containing four to six carbon atoms.

Among specific diepoxides of cycloaliphatic esters of dicarboxylic acids are the following:
bis(3,4-epoxycyclohexylmethyl) oxalate,
bis(3,4-epoxycyclohexylmethyl) adipate,
bis(3,4-epoxy-6-methylcyclohexylmethyl) adipate,
bis(3,4-epoxycyclohexylmethyl) pimelate, and the like.

Other suitable compounds are described in, for example, U.S. Pat. No. 2,750,395.

FORMULA 2

A 3,4-epoxycyclohexylmethyl-3,4-epoxycyclohexane carboxylate having the formula:

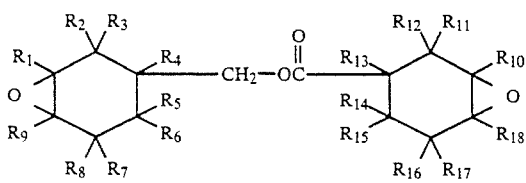

wherein $R^1$ through $R^{18}$, which can be the same or different, are as defined for $R_7$ to $R_{24}$ in Formula 1. Preferably the majority of $R^1$ through $R^{18}$ are hydrogen. Particularly desirable compounds are those wherein $R^1$ through $R^{18}$ are hydrogen.

Among specific compounds falling within the scope of Formula 2 are the following: 3,4-epoxycyclohexylmethyl-3,4-epoxycyclohexane carboxylate; 3,4-epoxy-1-methylcyclohexylmethyl-3,4-epoxy-1-methycyclohexane carboxylate; 6-methyl-3,4-epoxycyclohexylmethyl-6-methyl-3,4-epoxycyclohexane carboxylate; 3,4-epoxy-3-methylcyclohexylmethyl-3,4-epoxy-3-methylcyclohexane carboxylate; 3,4-epoxy-5-methylcyclohexylmethyl-3,4-epoxy-5-methylcyclohexane carboxylate. Other suitable compounds are described in, for example, U.S. Pat. No. 2,890,194.

FORMULA 3

Diepoxides having the formula:

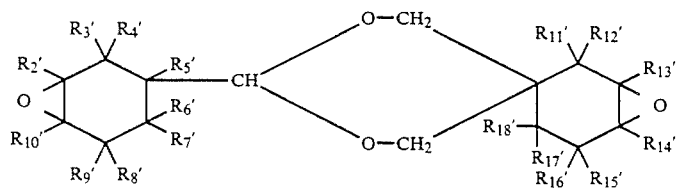

wherein the R's, which can be the same or different, are monovalent substituents such as hydrogen, halogen, i.e., chlorine, bromine, iodine or fluorine, or monovalent hydrocarbon radicals, or radicals as further defined in U.S. Pat. No. 3,318,822. Preferably a majority of the R's are hydrogen. Particularly desirable compounds are those wherein all the R's are hydrogen.

FORMULA 4

Preferred cycloaliphatic diepoxides are those in the family of bis(2,3-epoxycyclopentyl) ethers having the formula:

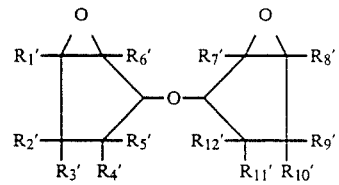

wherein the R's, which can be the same or different, are monovalent substituents such as hydrogen, halide, i.e., chlorine, bromine, iodine or fluorine atoms, or monovalent hydrocarbon radicals. Preferably a majority of the R's are hydrogen. Particularly desirable compounds are those wherein all the R's are hydrogen.

Other suitable cycloaliphatic epoxides include the following:

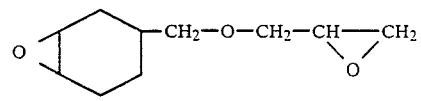

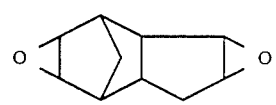

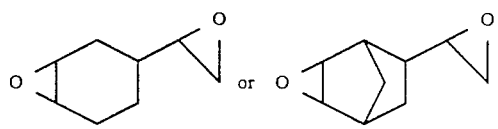

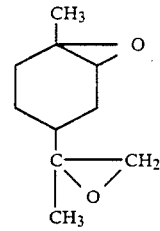

and the like.

Some presently preferred cycloaliphatic epoxides are the following:

3,4-Epoxycyclohexylmethyl-3,4-epoxycyclohexane carboxylate.

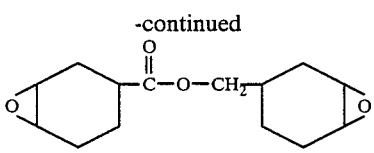

Bis(3,4-Epoxycyclohexylmethyl)adipate, and

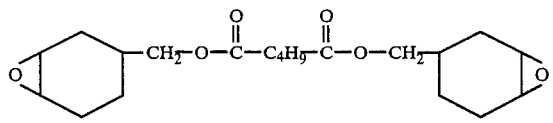

2-(3,4-Epoxycyclohexyl-5,5-spiro-3,4-epoxy)cyclohexane-meta-dioxane,

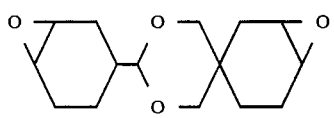

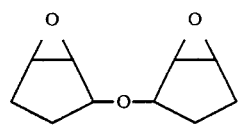

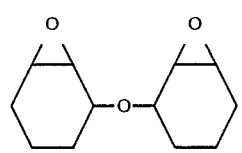

or mixtures thereof.

Epoxides with six membered ring structures can also be used, such as diglycidyl esters of organic diacids such as phthalic acid, partially hydrogenated phthalic acid or fully hydrogenated phthalic acid. A representative diglycidyl ester of phthalic acid is the following:

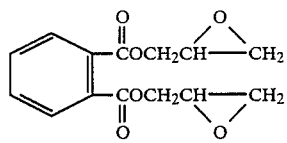

Diglycidyl esters of hexahydrophthalic acids are preferred.

The glycidyl-type epoxides are preferably diglycidyl ethers of bisphenol A which are derived from bisphenol A and epichlorohydrin and have the following formula:

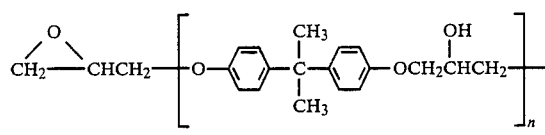

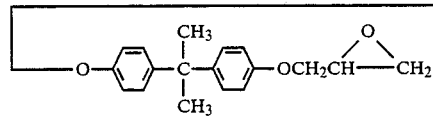

Also included are partially or fully hydrogenated compounds of the above general structure.

The cresol-novolac epoxy resins are multifunctional, solid polymers characterized by low ionic and hydrolyzable chlorine impurities, high chemical resistance, and thermal performance.

The epoxy phenol novolac resins are generally of the following formula:

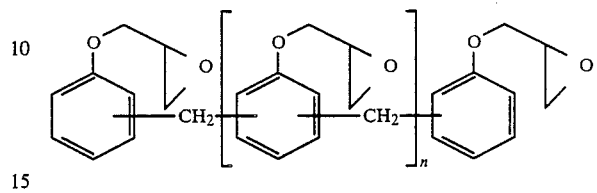

Also included are partially or fully hydrogenated compounds of the above general structure.

The polynuclear phenol-glycidyl ether-derived resins are generally of the formula:

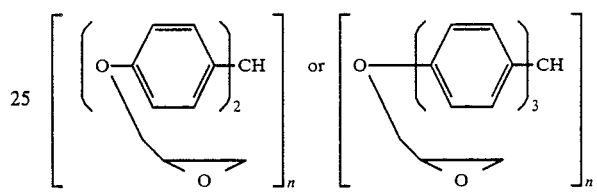

Among the aromatic and heterocyclic glycidyl amine resins which may be included herein are the following: tetraglycidylmethylenedianiline derived resins of the following formula:

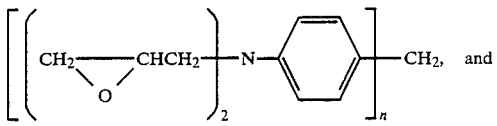

triglycidyl-p-aminophenol derived resins, triazine based resins and hydantoin epoxy resins of the formula:

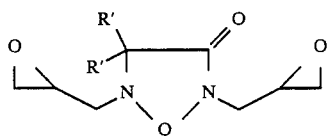

R' = CH$_3$

It is of course understood by those skilled in the art that when a photoinitiator is used only minor amounts of basic organic nitrogen containing epoxide compounds may be used so as not to interfere with the photocopolymerization reaction.

Although the diepoxides described above are presently preferred, the composition can include a substituted or unsubstituted cycloaliphatic monoepoxide. The unsubstituted cycloaliphatic monoepoxides include cyclohexene monoepoxide, and the like. The substituted cycloaliphatic monoepoxide can be substituted with alkyl groups of 1 to 9 carbon atoms, halogen, oxygen, ether, ester, hydroxyl or vinyl radicals. Preferably, the substituted cycloaliphatic monoepoxide is a vinyl substituted cycloaliphatic monoepoxide and is preferably selected from one or more of the following:

(1) 4-vinyl cyclohexane monoepoxide having the formula:

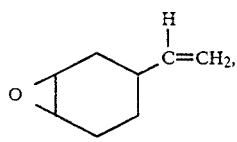

(2) Norbornene monoepoxide having the formula:

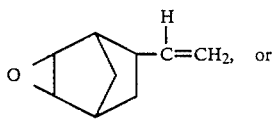

(3) limonene monoepoxide having the formula:

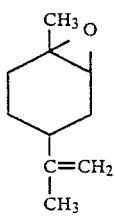

Another preferred substituted cycloaliphatic monoepoxide is hydroxyl substituted cycloaliphatic monoepoxide of the following formula:

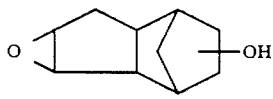

Epoxides having more than two epoxide groups are also useful in the present invention, and may have particular utility when very high cure rates or very low photoinitiator concentrations are employed.

In an embodiment, the cycloaliphatic epoxide and cyclic ether described above can be combined in a single molecule, ranging from complex polycyclic fused rings or bicyclic structures to single ring structures, e.g., epoxidized cyclic ethers. Various synthetic routes known to those skilled in the art can be employed to produce molecular structures containing at least one cyclic ether linkage selected from those described above and at least one epoxy group, preferably contained in a structure selected from those described above.

As apparent to those skilled in the art, such bifunctional molecules can be cured by cationic polymerization without the necessity of adding other cycloaliphatic epoxides or cyclic ethers, although it may be advantageous to use them in curable compositions containing such cycloaliphatic epoxides and/or cyclic ethers.

One type of a bicyclic ether-epoxide structure, for instance, can be prepared by condensing or coupling a molecule of a hydroxyalkyl cyclic ether such as tetrahydropyran-3-methanol with a molecule of a hydroxyalkyl cycloalkene such as tetrahydrobenzyl alcohol (3-cyclohexene-1-methanol) with an organic diacid or anhydride such as phthalic anhydride, then epoxidizing the double bond in the condensed molecule to produce a molecule containing separate rings which contain at least one ether linkage and at least one epoxy group, as in the structure shown below:

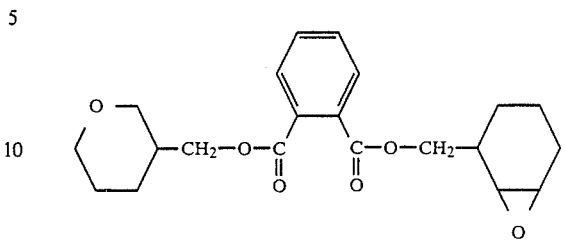

As apparent to those skilled in the art, the nature and size of the structure connecting the rings with the epoxy and ether functions can be varied by choosing from various diacids capable of esterifying the hydroxyalkyl groups, and using hydroxy alkyl substituents having from 1 to about 10 carbon atoms, for example.

A type of multifunctional compound containing the cyclic ether linkage and epoxide group, for instance, can be prepared by condensing or coupling two molecules of a hydroxyalkyl cyclic ether such as tetrahydropyran-2-methanol with one molecule of a dihydroxyalkyl cycloalkene such as 3-cyclohexene-1,1-dimethanol, using a compound such as a multifunctional isocyanate, then epoxidizing the double bond in a cycloalkene ring (e.g., the 3,4 position of the cyclohexene ring). The final molecule will contain one ring with an epoxy group and two rings with cyclic ether linkages, as shown in the formula below. The multifunctional isocyanate can be R(NCO)$_2$, where R is selected from alkyl groups having from 1 to about 10 carbon atoms, aryl groups having from 6 to about 10 carbon atoms, and cycloalkyl groups having from about 6 to about 10 carbon atoms. The compound resulting from such a condensation with a multifunctional isocyanate will be a dicyclic ether/monocycloaliphatic epoxide urethane compound.

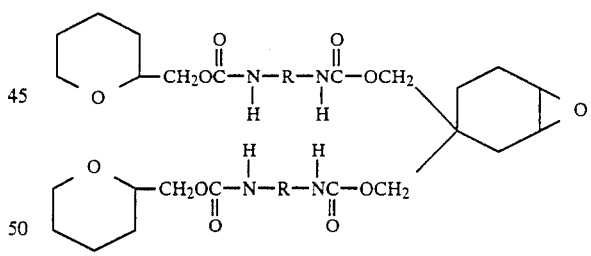

The cyclic ether linkage and epoxide group can be combined in single ring structures such as epoxidized cyclic ethers having from about 4 to about 20 ring carbon atoms and represented by the formula below where the sum of a and b is about 15 and a is the same or different from b. Such compounds can contain at least one ether linkage and at least one epoxy group, with the epoxy groups being separated from the ether linkage and from each other by at least one methylene group.

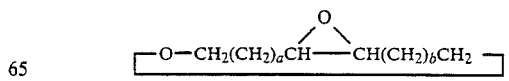

In conjunction with the cycloaliphatic epoxide, the composition of this invention can also include a poly(active hydrogen) organic compound. These poly (active hydrogen) organic compounds include any compatible organic compounds containing two or more active hydrogen atoms per molecule. The poly(active hydrogen) organic compounds are well known to those skilled in the art and include, for example, organic polyols and the like.

Substantially any of the organic polyols previously used in the art to make coating compositions can be used and are preferred as the poly(active hydrogen) organic compounds in this invention. Illustrative of the polyols useful in producing coating compositions in accordance with this invention are the polyether polyols such as polyhydroxyalkanes and polyoxyalkylene polyols, the acrylic and vinyl polyols, the polyester polyols, the polycaprolactone polyols, and other lactone polyols such as polyvalerolactone polyols, polymethylcaprolactone polyols, and the like, the polymer/polyols, and the like. Among the polyether polyols which can be employed are those selected from one more of the following classes of compositions, alone or in admixture, known to those skilled in the art:

(a) Alkylene oxide adducts of polyhydroxyalkanes;

(b) Alkylene oxide adducts of non-reducing sugars and sugar derivatives;

(c) Alkylene oxide adducts of phosphorous and polyphosphorous acids.

(d) Alkylene oxide adducts of polyphenols;

(e) The polyols from natural oils, such as castor oil and the like.

Illustrative alkylene oxide adducts of polyhydroxyalkanes include, among others, the alkylene oxide adducts of ethylene glycol, propylene glycol, 1,3-dihydroxypropane, 1,3-dihydroxybutane, 1,4-dihydroxybutane, 1,4-, 1,5-, and 1,6-dihydroxyhexane, 1,2-, 1,3-, 1,4-, 1,6-, and 1,8-dihydroxyoctane, 1,10-dihydroxydecane, glycerol, 1,2,4-trihydroxybutane, 1,2,6-trihydroxyhexane, 1,1,1-trimethylolethane, 1,1,1-trimethylolpropane, pentaerythritol, polycaprolactone, xylitol, arabitol, sorbitol, mannitol, and the like. A preferred class of alkylene oxide adducts of polyhydroxyalkanes are the ethylene oxide, propylene oxide and butylene oxide, adducts of trihydroxyalkanes or mixtures thereof.

A further class of polyether polyols which can be employed are the alkylene oxide adducts of the non-reducing sugars, wherein the alkylene oxides have from 2 to 4 carbon atoms. Among the non-reducing sugars and sugar derivatives contemplated are sucrose, alkyl glycosides, such as methyl glucoside, ethyl glucoside, and the like, glycol glycosides, such as ethylene glycol glucoside, propylene glycol glucoside, glycerol glucoside, 1,2,6-hexanetriol glucoside, and the like, as well as the alkylene oxide adducts of the alkyl glycosides as set forth in U.S. Pat. No. 3,073,788.

The alkylene oxide adducts of phosphorous and polyphosphorous acids are another useful class of polyether polyols. Ethylene oxide, 1,2-epoxypropane, the epoxybutanes, 3,-chloro-1,2-epoxypropane, and the like are preferred alkylene oxides. Phosphoric acid, phosphorous acid, the polyphosphoric acids, such as, tripolyphosphoric acid, the polymetaphosphoric acids, and the like are desirable for use in this connection.

A still further useful class of polyether polyols is the polyphenols, and preferably the alkylene oxide adducts thereof wherein the alkylene oxides have from 2 to 4 carbon atoms. Among the polyphenols which are contemplated are, for example, bisphenol A, bisphenol F, condensation products of phenol and formaldehyde, the novolac resins, condensation products of various phenolic compounds and acrolein, the simplest member of this class being the 1,1,3-tris(hydroxyphenol) propanes; condensation products of various phenolic compounds and glyoxal, glutaraldehyde, and other dialdehydes, the simplest members of this class being the 1,1,2,2,-tetra bis(hydroxyphenol) ethanes, and the like.

The polyether polyols described hereinabove can have hydroxyl numbers which vary over a wide range. In general, the hydroxyl numbers of the above described polyols employed in this invention can range from 15, and lower, to about 900, and higher. The hydroxyl number is defined as the number of milligrams of potassium hydroxide required for the complete neutralization of the fully phthalated derivative prepared from 1 gram of polyol. The hydroxyl number can also be defined by the equation:

$$OH = \frac{56.1 \times 1000 \times f}{m.w.}$$

where,

OH = hydroxyl number of the polyol;

f = functionality, that is, average number of hydroxyl groups per molecule of polyol; and m.w. = molecular weight of the polyol.

The polyether polyols described hereinabove can be prepared by conventional methods and are commercially available from a number of manufacturers.

The polycaprolactone polyols, alone or in admixture, that can be used to prepare the coating compositions of this invention include any of the known polycaprolactone polyols that are commercially available and that are fully described, for example, in U.S. Pat. No. 3,169,945. As described in this patent, the polycaprolactone polyols are produced by the catalytic polymerization of an excess of a caprolactone and an organic polyfunctional initiator having at least two reactive hydrogen atoms. The organic functional initiators can be any polyhydroxyl compound, as is shown in U.S. Pat. No. 3,169,945. Illustrative thereof are the diols, such as, ethylene glycol, diethylene glycol, triethylene glycol, 1,2-propylene glycol, dipropylene glycol, 1,3-propylene glycol, polyethylene glycol, polypropylene glycol, poly(oxyethylene-oxypropylene) glycols, and similar polyalkylene glycols, either blocked, capped or heteric, containing up to about 40 or more alkyleneoxy units in the molecule, 3-methyl-1-5-pentanediol, cyclohexanediol, 4,4'-methylenebis-cyclohexanol, 4,4'-isopropylidene bis-cyclohexanol, xylenediol, 2-(4-hydroxymethylphenyl) ethanol, 1,4-butanediol, 1,6-hexanediol and the like; triols such as glycerol, trimethylolpropane, 1,2,6-hexanetriol, triethanolamine, triisopropanolamine, and the like; tetrols, such as erythritol, pentaerythritol; N,N,N',-N'-tetrakis(2-hydroxyethyl) ethylene diamine, and the like.

When the organic functional initiator is reacted with the caprolactone, a reaction occurs that can be represented in its simplest form by the equation:

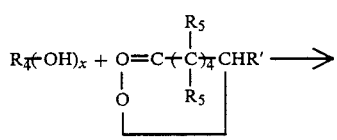

-continued

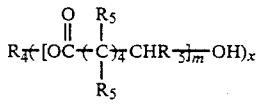

In this equation, the organic functional initiator is the $R_4$—$(OH)_x$ compound and the caprolactone is the

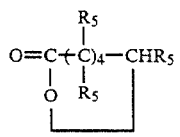

compound; this can be caprolactone itself or a substituted caprolactone wherein $R_5$ is hydrogen or an alkyl, alkoxy, aryl, cycloalkyl, alkaryl or aralkyl group having up to twelve carbon atoms and wherein at least six of the $R_5$ groups are hydrogen atoms, as shown in U.S. Pat. No. 3,169,945. In this expression, $R_5$ can be the same or different in each particular instance. The polycaprolactone polyols that are used are shown by the formula on the right hand side of the equation; they can have an average molecular weight of from 200 to about 6,000. The preferred polycaprolactone polyol compounds are those having an average molecular weight of from about 290 to about 6,000, most preferably from about 290 to 3,000. The most preferred are the polycaprolactone diol compounds having an average molecular weight of from about 290 to about 1,500 and the polycaprolactone triol and tetrol compounds having an average molecular weight of from about 290 to about 3,000; these are most preferred because of properties resulting from their low viscosity. In the formula, m is an integer representing the average number of repeating units needed to produce the compound having said molecular weights. The hydroxyl number of the polycaprolactone polyol can be from about 15 to 600, preferably from 20 to 500; and the polycaprolactone can have an average of from 2 to 8, preferably 2 to 4, hydroxyl groups. Minor amounts of polycaprolactones having an average of approximately one hydroxyl group can also be employed.

Illustrative of polycaprolactone polyols that can be used in the coating compositions of this invention, one can mention the reaction products of a polyhydroxyl compound having an average from 2 to 6 hydroxy groups with caprolactone. The manner in which this type of polycaprolactone polyol is produced is shown in U.S. Pat. No. 3,169,945 and many such compositions are commercially available. In the following Table A, there are listed illustrative polycaprolactone polyols. The first column lists the organic initiator that is reacted with the caprolactone, and the average molecular weight of the polycaprolactone polyol is shown in the second column. Knowing the molecular weights of the initiator and of the polycaprolactone polyol, one can readily determine the average number of molecules of caprolactone (CPL Units) that reacted to produce the compounds; this figure is shown in the third column.

TABLE A

| | POLYCAPROLACTONE POLYOLS | | |
|---|---|---|---|
| | Initiator molecules | Average MW of polyol | Average of CPL units in |
| 1 | Ethylene glycol | 290 | 2 |

TABLE A-continued

| | POLYCAPROLACTONE POLYOLS | | |
|---|---|---|---|
| | Initiator molecules | Average MW of polyol | Average of CPL units in |
| 2 | Ethylene glycol | 803 | 6.5 |
| 3 | Ethylene glycol | 2,114 | 18 |
| 4 | Propylene glycol | 874 | 7 |
| 5 | Octylene glycol | 602 | 4 |
| 6 | Decalene glycol | 801 | 5.5 |
| 7 | Diethylene glycol | 527 | 3.7 |
| 8 | Diethylene glycol | 847 | 6.5 |
| 9 | Diethylene glycol | 1,246 | 10 |
| 10 | Diethylene glycol | 1,998 | 16.6 |
| 11 | Diethylene glycol | 3,526 | 30 |
| 12 | Triethylene glycol | 754 | 5.3 |
| 13 | Polyethylene glycol (MW 200)[1] | 713 | 4.5 |
| 14 | Polyethylene glycol (MW 600)[1] | 1,398 | 7 |
| 15 | Polyethylene glycol (MW 1500)[1] | 2,868 | 12 |
| 16 | 1,2-Propylene glycol | 646 | 5 |
| 17 | 1,3-Propylene glycol | 988 | 8 |
| 18 | Dipropylene glycol | 476 | 3 |
| 19 | Polypropylene glycol (MW 425)[1] | 835 | 3.6 |
| 20 | Polypropylene glycol (MW 1000)[1] | 1,684 | 6 |
| 21 | Polypropylene glycol (MW 2000)[1] | 2,456 | 4 |
| 22 | Hexylene glycol | 916 | 7 |
| 23 | 2-Ethyl-1,3-hexanediol | 602 | 4 |
| 24 | 1,5-Pentanediol | 446 | 3 |
| 25 | 1,4-Cyclohexanediol | 629 | 4.5 |
| 26 | 1,3-Bis(hydroxyethyl)-benzene | 736 | 5 |
| 27 | Glycerol | 548 | 4 |
| 28 | 1,2,6-Hexanetriol | 476 | 3 |
| 29 | Trimethylolpropane | 590 | 4 |
| 30 | Trimethylolpropane | 750 | 5.4 |
| 31 | Trimethylolpropane | 1,103 | 8.5 |
| 32 | Triethanolamine | 890 | 6.5 |
| 33 | Erythritol | 920 | 7 |
| 34 | Pentaerythritol | 1,219 | 9.5 |
| 35 | 1,4-Butanediol | 546 | 4.0 |
| 36 | Neopentyl glycol | 674 | 5.0 |

[1]Average molecular weight of glycol

The structures of the compounds in the above tabulation are obvious to one skilled in the art based on the information given. The structure of compound No. 7 is:

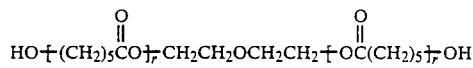

wherein the variable r is an integer, the sum of r+r has an average value of 3.7 and the average molecular weight is 527. The structure of compounds No. 20 is:

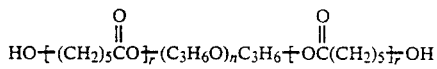

wherein the sum of r+r has an average value of 6 and the average molecular weight is 1,684. This explanation makes explicit the structural formulas of compounds 1 to 34 set forth above.

Polycaprolactone hexols suitable for use in the present invention can be prepared by the catalytic polymerization of an excess of polycaprolactone polyols and a cycloaliphatic epoxide. Illustrative polycaprolactone polyols useful in the preparation of polycaprolactone hexols include polycaprolactone diols, polycaprolactone triols and the like, including mixtures thereof. Many of these polycaprolactone polyols are commercially available from Union Carbide Corp., Old Ridgebury Road, Danbury, CT 06817. Cycloaliphatic epoxides suitable for use in preparing the polycaprolactone hexols include 3,4-epoxycyclohexylmethyl-3,4-epoxycyclohexane carboxylate, bis (3,4-epoxycyclohexylmethyl) adipate, vinyl cyclohexane dioxide and the like. Many of these cycloaliphatic epoxides are also commercially available from Union Carbide Corp. A suitable polymerization catalyst is diethylammonium triflate, which is commercially available from the 3M Company, Commercial Chemical Div., 2501 Hudson Road, St. Paul, MN 55119, as FC-520.

A preferred method for preparing the polycaprolactone hexols is comprised of adding one or more polycaprolactone triols to a reactor, heating the polycaprolactone triols to a temperature of about 100° C. and adding the catalyst using a nitrogen sparge as soon as the polycaprolactone triols are molten. The polycaprolactone triols and catalyst mixture is then heated to a temperature of from about 150° C. to about 200° C. and a cycloaliphatic epoxide is added to the mixture. The reaction is carried out for about one hour to about three hours or until the oxirane content has been reduced to a nil or to an almost nil value. A modification of this process can involve initially adding all of the ingredients into the reactor. A further modification of this method can involve a vacuum treatment of from 10 to 30 minutes after the catalyst addition and/or the use of a vacuum during the heating of polycaprolactone triols to a molten state. Preferred polycaprolactone hexols suitable as ingredients in the coating compositions of this invention have an average molecular weight of from about 600 to about 1500.

The polymer/polyols that can be used to prepare the coating compositions of this invention are known materials. Such polymer/polyols can be produced by polymerizing one or more ethylenically unsaturated monomers dissolved or dispersed in a base polyol in the presence of a free radical catalyst. The production of polymer/polyols is more fully described in U.S. Pat. Reissue No. 28,715, U.S. Pat. Reissue No. 29,118, U.S. Pat. No. 3,652,639, U.S. Pat. Reissue No. 29,014, U.S. Pat. No. 3,950,317, U.S. Pat. No. 4,208,314, U.S. Pat. No. 4,104,236, U.S. Pat. No. 4,172,825 and U.S. Pat. No. 4,198,488.

While poly(oxypropylene) polyols are preferred, substantially any of the polyols previously used in the art to make polymer/polyols can be used as the base polyol. Illustrative of the base polyols useful in producing polymer/polyol compositions are the polyether polyols such as polyhydroxyalkanes and polyoxyalkylene polyols, or the like. Among the base polyols which can be employed are those selected from one or more of the following classes of compositions, alone or in admixture, known to those skilled in the art and described more fully hereinabove:

(a) Alkylene oxide adducts of polyhydroxyalkanes;
(b) Alkylene oxide adducts of non-reducing sugars and sugar derivatives;
(c) Alkylene oxide adducts of phosphorous and polyphosphorous acids;
(d) Alkylene oxide adducts thereof of polyphenols;
(e) The polyols from natural oils, such as castor oil, and the like.

The most preferred base polyols employed in the polymer/polyols, which are useful as ingredients in the coating compositions of this invention, include the poly(oxypropylene) polyols. It should be appreciated that a blend or mixture of more than one base polyol can be utilized, if desired, to form the polymer/polyol.

Conceptually, the monomers used in preparing the polymer/polyols can comprise any ethylenically unsaturated monomer or monomers. A variety of monomers are disclosed in the patents relating to polymer/polyols previously referred to. The selection of the monomer or monomers used will depend on considerations such as the relative cost of the monomers and the product characteristics required for the intended application.

The preferred monomer and monomer mixture used to make the polymer portion of the polymer/polyols are acrylonitrile and a mixture of acrylonitrile and styrene, respectively. The relative weight proportions of acrylonitrile to styrene can range from about 80:20 to about 20:80. It may be desirable in some applications to utilize, with acrylonitrile, a comonomer other than styrene. Representative examples of suitable comonomers include methyl methacrylate, vinyl chloride and vinylidene chloride.

The polymer and polyol content of the polymer/polyols can vary within wide limits depending upon the requirements of the anticipated end use application. In general, the polymer content will vary from about 10 to about 50 percent, based upon the weight of the polymer/polyol. The polyol content of the polymer/polyols varies from about 50 to about 90 percent, based upon the weight of the polymer/polyol.

The polymer/polyols may, if desired, be blended with other conventional polyols described hereinabove to reduce the polymer content to the level desirable for the particular end use application. Blends in which the resulting polymer content is as low as 4 percent of the total weight of the blend or even less may be useful in the coating compositions of this invention.

The most preferred classes of polyols employed in the coating compositions of this invention are the polycaprolactone polyols such as those sold under the trademarks TONE-0200, TONE-0201 and TONE-0305 commercially available from Union Carbide Corp., the dihydroxyl functional polytetramethylene oxide polyols, such as sold under the trademarks Polymeg ® 650, 1000 and 2000 commercially available from Quaker Oats Company, Merchandise Mart Plaza, Chicago, Ill. 60654; and Terathane ® 650, 1000, 2000 and 2900, commercially available from DuPont Chemicals and Pigments Dept., Wilmington, Del. 19898; the polymer/polyols, such as sold under the trademarks NIAX ® Polymer Polyols 31-23 and 34-28 commercially available from Union Carbide Corporation, and, of course, the ethylene oxide and propylene oxide adducts including ethylene glycol, diethylene glycol, the poly(oxyethylene) glycols; propylene, dipropylene and tripropylene glycols; the poly(oxypropylene) glycols, triols and higher functionality polyols such as sold under the marks LHT-67, LHT-112, and LG-56, all commercially available from Union Carbide Corp.

A preferred alkylene oxide derived polyol suitable for use in the coating compositions of this invention has the following formula:

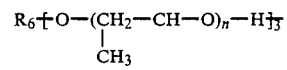

wherein $R_6$ is an alkyl group of 3 to 10 carbon atoms, preferably 3 carbon atoms, and n is an integer of from about 10 to about 25. These polyols also include poly- (oxypropylene-oxyethylene) polyols; however, desirably, the oxyethylene content should comprise less than 80 percent of the total and preferably less than 60 percent. The ethylene oxide, when used, can be incorporated in any fashion along the polymer chain. Stated another way, the ethylene oxide can be incorporated either in internal blocks, as terminal blocks, such as the propylene oxide polyols capped with ethylene oxide, i.e., such as sold under the trademarks NIAX ® Polyols 11-27 and 11-34 and E-474, commercially available from Union Carbide Corp., or may be randomly distributed along the polymer chain. As is well known in the art, the polyols that are most preferred herein contain varying small amounts of unsaturation. Unsaturation, in itself, does not affect in any adverse way the formation of the coating compositions in accordance with the present invention.

Other representative examples of preferred organic polyols that may be employed in the coating compositions of this invention include copolymers of hydroxypropyl and hydroxyethyl acrylates and methacrylates with other free radical-polymerizable monomers, such as acrylate esters, vinyl halides, vinyl acetate or styrene; copolymers containing pendent hydroxy groups formed by hydrolysis or partial hydrolysis of vinyl acetate copolymers, polyvinylacetal resins containing pendent hydroxyl groups; modified cellulose polymers, such as hydroxyethylated and hydroxypropylated cellulose; hydroxy-terminated polyesters and hydroxy-terminated polyalkadienes. The polyester polyols are the reaction products of polyfunctional organic carboxylic acids and polyhydric alcohols and include, for example, poly(hexamethylene adipate), poly(ethylene adipate), poly(butylene adipate) and the like. Many of these organic polyols can be prepared by conventional methods and are commercially available from a number of manufacturers, such as, polyvinylacetal resins commercially available from Monsanto Chemical Company, 800 No. Lindbergh Blvd., St. Louis, Mo. 63166, and sold under the trademarks Butvar ® B-72A, B-73, B-76, B-90 and B-98 and Formvar ® 7/70, 12/85, 7/95S, 7/95E, 15/95S and 15/95E; an aliphatic polyester diol commercially available from Rohm and Haas Co., Independence Mall West, Philadelphia, Pa. 19105, sold under the trademark Paraplex ® U-148; saturated polyester polyols commercially available from Mobay Chemical Company, Penn-Lincoln Parkway East, Pittsburgh, Pa. 15205, sold under the trademarks Multron ® R-2, R-12A, R-16, R-18, R-38, R-68, and R-74; a hydroxypropylated cellulose having an equivalent weight of approximately 100 commercially available from Hercules, Inc., 910 Market Street, Wilmington, Del. 19899, sold under the trademark Klucel ® E; and a cellulose acetate butyrate ester having a hydroxyl equivalent weight of approximately 400 commercially available from Eastman Kodak Co., Organic Chemicals Dept., 343 State Street, Rochester, N.Y. 14650, as Alcohol Soluble Butyrate, or other commercially available cellulose acetate butyrates.

The poly(active hydrogen) organic compounds utilized in the coating compositions of this invention can be mixtures or blends of organic polyols. For example, when utilizing a polycaprolactone polyol, it may be desirable to mix or blend one or more of a propylene oxide polyol, a propylene oxide polyol capped with ethylene oxide, a polytetramethylene oxide polyol or a polymer/polyol therewith. Other mixtures or blends may similarly be used if desired.

Other compounds which can be used in conjunction with the cycloaliphatic epoxides in the compositions of the present invention include cyclic vinyl ethers, described above, and linear vinyl ethers.

The linear vinyl ethers are well known in the art, and many are commercially available. The vinyl ethers include the alkyl vinyl ethers, the aryl vinyl ethers, the divinyl ethers, the alpha and the beta substituted vinyl ethers and the functionally substituted vinyl ethers. The alkyl vinyl ether monomers include:

Methyl, ethyl, isopropyl, n-butyl, isobutyl, s-butyl, t-butyl, n-amyl, isoamyl, 1,2-dimethylpropyl, n-hexyl, 1,2,2-trimethylpropyl, 2-ethylbutyl, 1,3-dimethylbutyl, 2,2-dimethylbutyl, diisopropylmethyl, n-octyl, 2-ethylhexyl, 1-methylheptyl; 2,2-dimethylhexyl, n-decyl, 2,2-dimethyloctyl, 2,2-dimethyldecyl, n-tetradecyl; 2,2-dimethyldodecyl, n-hexadecyl, 2,2-dimethyltetradecyl, n-octadecyl, and oleyl viny ethers.

The aryl vinyl ether monomers include: phenyl, o-cresyl, p-cresyl, p-chlorophenyl, 2,4-dichlorophenyl, 2,4,6-trichlorophenyl, alpha-naphthyl, and beta-naphthyl vinyl ethers.

The divinyl ethers include the following:

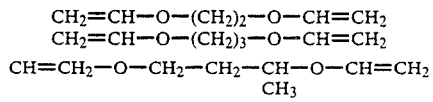

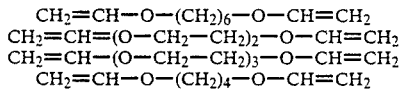

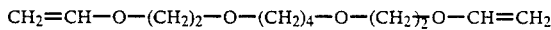

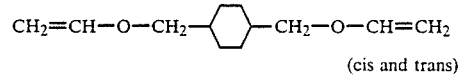

(cis and trans)

esterdiol divinyl ethers.

The alpha and beta substituted vinyl ethers including the following:
methyl alpha-methylvinyl ether,
methyl beta-chlorovinyl ether,
methyl alpha-methylvinyl ether (cis) (trans),
methyl beta-chlorovinyl ether,
ethyl alpha-ethylvinyl ether,
ethyl alpha-methylvinyl ether (cis) trans),
ethyl alpha-phenylvinyl ether,
isopropyl beta-methylvinyl ether (cis) (trans),
n-butyl-alpha-methylvinyl ether (cis) (trans)
isobutyl-alpha-methylvinyl ether (cis) (trans), and
t-butyl-alpha-methylvinyl ether (cis) (trans).

Functionally substituted vinyl ethers are of the formula $CH_2=CHOR$, wherein R is selected from: $CH_2CH_2OH$, $CH_2CH_2CH_2CH_2OH$, $CH_2CH_2Cl$, $CH_2CH_2OCH_3$, $CF_3$, $CF(CF_3)_2$, $CF(CF_3)(CF_2Cl)$, $CF(CF_2Cl)_2$, $CH_2CH_2OCH_2CH_2OH$, $CH_2CH_2CHOHCH_3$, $CH_2CH_2OCH_2CH_2OCH_3$, $CH_2CH_2OCH_2CH_2OC_2H_5$, and $CH_2CH=CH_2$.

Other additional ingredients which can be used in conjunction with the cycloaliphatic epoxides include poly(vinyl halides) such as poly(vinyl chlorides), poly(vinyl esters) such as poly(vinyl acetate), polycaprolactones with structures as discussed above in conjunction with polycaprolactone polyols and copolymers of vinyl halides with vinyl esters, glycidyl acrylates, hydroxyalkyl acrylates, and mixtures of such monomers.

To photocopolymerize the compositions of the present invention in the presence of radiation, a photoinitiator is used which will produce a cationic catalyst, including Bronsted-Lowry or Lewis acids, upon exposure to radiation in solution. The photoinitiator can be used in any suitable amount, but an advantage of the present invention is that much higher reaction or cure rates can be attained with even less than the normal proportions of photoinitiator; conversely, if an increased cure rate is not needed, a greatly reduced quantity of the costly photoinitiator can be sufficient. This not only reduces the cost of the composition, but can also be advantageous where it is desirable to minimize the amounts of metal ions or other photoinitiator residues in the cured coating, for example, in the production of nonconductive components of semiconductor devices. Using even relatively small amounts of the photoinitiator, high cure rates can be produced to allow almost any curing line speed desired.

Conventionally, such photoinitiators are used in photocurable compositions containing epoxides in proportions ranging from 0.1 to 30 parts by weight per 100 parts by weight of the epoxides. With the present invention, cure rates at least as fast as those obtained with such conventional quantities of photoinitiator can be obtained by using proportions of photoinitiator ranging from about 0.05 to about 20 weight percent of the total composition. The higher proportions in this range may be used in the curing of pigmented compositions or producing very high curing speeds. Relatively low proportions can be used, preferably in the range of from about 0.1 to 15 weight percent, and most preferably from about 0.5 to about 5 weight percent. In an embodiment in which the quantity of photoinitiator is to be minimized, the photoinitiator can be from about 0.05 to about 1 weight percent of the total composition. Alternatively, the photoinitiator can be present as from about 0.01 to about 10 weight percent of the cycloaliphatic epoxide in the composition.

In the method of the present invention, an effective amount of a cyclic ether-containing compound is included in the epoxide composition to be cured, allowing a reduced amount of photoinitiator to be used (a fraction of the amount normally used with a curable composition lacking such cyclic ether, usually less than half such amount) and at least a twofold increase in cure rate as reflected by line speed to be obtained. Alternatively, the amount of photoinitiator can be greatly reduced, for example, to a level less than one-fifth that normally required for curing a curable composition lacking such cyclic ether, and the reaction rate retained as approximately the same. Using amounts of photoinitiators conventionally used in the photocuring of comparable compositions lacking the cyclic ether, substantial increases in the cure rate can be obtained, amounting to tenfold, twentyfold or even greater.

Curing speeds in the industry are generally represented by the line speeds which can be maintained to produce the desired degree of curing in a given type of coating, using particular curing apparatus. The actual times of exposure to the curing lamp or other radiation source will depend upon the length and strength of the source as well as the line speed. The compositions of the present invention can be cured effectively in exposure times ranging from about 0.01 to about 50 seconds, preferably from about 0.1 to about 20 seconds, and most preferably from about 1 to about 10 seconds. Those skilled in the art will recognize that effective curing represents a state of cure such that polymerization has been initiated and that further cure can take place as a function of time and/or under the influence of thermal energy after the radiation source no longer impinges on the coating being cured. That is, systems cured with onium salts can continue to cure in the absence of radiation after the photoinitiator has been photolyzed or decomposed into its active species.

The photoinitiator can be added to the composition in the appropriate proportion just before curing, or included in appropriate proportions in prepared compositions which are to be shipped and/or stored. It has been discovered that such compositions containing photoinitiator are surprisingly stable provided they are protected from light.

The photoinitiators which can be used in the present invention include one or more of a metal fluoroborate and a complex of boron trifluoride, as described in U.S. Pat. No. 3,379,653; a bis(perfluoroalkylsulfonyl) methane metal salt, as described in U.S. Pat. No. 3,586,616; an aryldiazonium compound, as described in U.S. Pat. No. 3,708,296; an aromatic onium salt of Group VIa elements, as described in U.S. Pat. No. 4,058,400; an aromatic onium salt of Group Va elements, as described in U.S. Pat. No. 4,069,055; a dicarbonyl chelate of a Group IIIa-Va element, as described in U.S. Pat. No. 4,086,091; a thiopyrylium salt, as described in U.S. Pat. No. 4,139,655; a Group VIa element having an $MF_6$ anion where M is selected from P, As and Sb, as described in U.S. Pat. No. 4,161,478; a triarylsulfonium complex salt, as described in U.S. Pat. No. 4,231,951; and an aromatic iodonium complex salt and an aromatic sulfonium complex salt, as described in U.S. Pat. No. 4,256,828. Preferred photoinitiators include polyarylsulfonium complex salts, aromatic sulfonium or iodonium salts of halogen-containing complex ions, and aromatic onium salts of Group IIIa, Va and VIa elements. Some of such salts are commercially available, such as those sold under the trademarks FC-508 or FX-512 (polyarylsulfonium hexafluorophosphate) and FC-509 (available from 3M Company), and UVE-1014 (polyarylsulfonium hexafluoroantimony salt available from General Electric Company). Other useful photoinitiators are disclosed in U.S. patent application Ser. No. 480,298, filed on Mar. 29, 1983 and assigned to Union Carbide Corp., now abandoned, which application is hereby incorporated by reference in its entirety.

Presently preferred photoinitiators include aromatic onium salts of phosphorus, sulfur, arsenic, iodine and antimony.

If desired, the efficiencies of the various photoinitiators useful in the present invention can be increased by the use of photosensitizers known to those skilled in the art. Such compounds absorb radiation (usually visible light) in a region of the spectrum in which the photoinitiator is transparent and then transfer the absorbed energy by one mechanism or another to the photoinitiator, inducing its photolysis. In addition to improving the overall efficiency of photoinitiators by increasing their effective light absorption, such photosensitizers make it possible to carry out photopolymerization using different portions of the radiation spectrum, e.g., visible light instead of or in addition to UV light.

Suitable photosensitizers for diaryliodonium salts are disclosed by Crivello and Lam in The Journal of Polymer Science, Chemical Education, Vol. 16, pp. 2441–51 (1978), while suitable photosensitizers for triarylsulfonium salts are disclosed by Smith in U.S. Pat. No.

4,069,054 and by Crivello and Lam (perylene) in The Journal of Polymer Science, Chemical Education, Vol. 17, pp. 1059–65 (1979), which disclosures are incorporated herein by reference. As known to those skilled in the art, photosensitizers comprising amines or other basic groups should be used only in minor amounts which will not interfere with the photocopolymerization reaction.

The compositions of the present invention may include additives, such as oils, particularly silicone oil, surfactants, such as silicone-alkylene oxide copolymers and acrylic polymers, sold under the trade names such as the Modaflows (obtained from Monsanto Chemical Co.), silicone oil containing aliphatic epoxide groups, fluorocarbon surfactants; low molecular weight alcohols; products sold under the Cellosolve ® trademark, such as butyl Cellosolve ®; carbitols, such as butyl carbitol and diethyleneglycol, and the like.

If desired, one may include in the compositions of this invention various conventional non-basic fillers (e.g., silica, talc, glass beads or bubbles, clays, powdered metal such as aluminum, silver, zinc oxide, etc.) and other additives such as viscosity modifiers, rubbers, tackifying agents, pigments, solvents or diluents and the like.

The photocopolymerizable compositions of this invention are particularly suitable in a variety of applications in the fields of protective coatings and graphic arts due to their flexibility, impact resistance, abrasion resistance, hardness and adhesion to rigid, resilient and flexible substrates, such as metal, plastic, rubber, glass, paper, wood and ceramics. They can be cured for use as metal and plastic finishes, coatings for cans, electronic components, appliances, etc. and as inks, adhesives and sealants. These compositions can be cured much more rapidly than prior art compositions, and reduced quantities of the costly photoinitiator can be used, thus markedly reducing the cost of a formulated coating.

The photopolymerization or radiation curing of the compositions of the invention occurs upon exposure of the compositions to any source of radiation emitting actinic radiation to a wavelength within the ultraviolet and visible spectral regions. Suitable sources of radiation include mercury, xenon, carbon arc lamps, sunlight, etc. Exposure times may be broadly from less than about 1 second to 10 minutes or more depending upon the amounts of particular polymerizable materials and photoinitiator being utilized and depending upon the radiation source type and dimensions, the substrate distance from the source and the thickness of the coating to be cured. An advantage of the present invention is that good cures can be obtained in relatively brief exposure times, as described above. The compositions may also be photopolymerized by exposure to gamma rays, X-rays or electron beam irradiation. Generally speaking, the necessary dosage is from less than 1 megarad to 100 megarads or more.

The compositions of this invention may be prepared simply by mixing the formulation ingredients together, preferably under "safe light" conditions when the photoinitiator is incorporated.

In accordance with the present invention, the proportions of the ingredients of the composition and the photoinitiator are such that relatively brief radiation exposures can be used, so as to permit high line speeds for the curing and other processes.

EXAMPLES

The following Examples serve to give specific illustrations of the practice of this invention but they are not intended in any way to act to limit the scope of this invention. The numbered examples represent the present invention. The lettered examples do not represent the present invention and are for comparison purposes.

The following designations used in the examples and elsewhere in the present application have the following meanings:

| ABBREVIATION | DEFINITION |
|---|---|
| Butyl Cellosolve ®: | An ethylene glycol monobutyl ether obtained from Union Carbide Corp. |
| Diglycidyl Ether 1: | Epon ® 828, A diglycidyl ether of Bisphenol A that has an equivalent weight of 185–192, obtained from Shell Chemical Co., Box 2463, Houston, Texas 77001. |
| Diglycidyl Ether 2: | Epon ® 1001, A diglycidyl ether of Bisphenol A that has an equivalent weight of 450–550, obtained from Shell Chemical Co. |
| Epoxy 1: | 3,4-Epoxycyclohexylmethyl-3,4-epoxycyclohexane carboxylate, theoretical molecular weight of 274, obtained from Union Carbide Corp. |
| Epoxy 2: | Bis-(3,4-epoxycyclohexyl methyl)adipate, obtained from Union Carbide Corp. |
| Epoxy 3: | 2-(3,4-Epoxycyclohexyl-5,5-spiro-3,4-epoxy)cyclohexane-meta-dioxane with an average epoxy equivalent weight of 133 to 154, obtained from Union Carbide Corp. |
| Epoxy 4: | Bis(2,3-epoxycyclopentyl) ether, obtained from Union Carbide Corp. |
| fpm: | Feet per minute |
| g.: | Grams |
| MTHP: | 2-methoxytetrahydropyran |
| M.W., m.w.: | Molecular weight, number average, unless otherwise indicated. |
| Photoinitiator 1: | UVE-1014, A solution of a polyarylsulfonium hexafluoroantimony salt with a specific gravity of 1.39 and a Brookfield viscosity of 74 centipoise at 25° C. (obtained from General Electric Co., Polymers Product Dept., Pittsfield, MA 01201.) |
| Photoinitiator 2: | FC-508, A solution of a polyarylsulfonium hexafluorophosphate with a specific gravity of 1.33 and a Brookfield viscosity of about 4,000 centipoise at 25° C. (obtained from 3M Co., Chemical Division, 2501 Hudson Road, St. Paul, MN 55119.) |
| Polyol 1: | A trihydroxyfunctional polycaprolactone polyol with an average hydroxyl number of 310 and an average molecular weight of 540. (Obtained from Union Carbide Corp., Old Ridgebury Road, Danbury, CT 06817). |
| Polyol 2: | A propylene oxide polyol with |

| ABBREVIATION | DEFINITION |
|---|---|
| | an average hydroxyl number of 112.0 and a hydroxyl functionality greater than 2.0, obtained from Union Carbide Corp. |
| Polyol 3: | A propylene oxide polyol with an average hydroxyl number of 67.0 and a hydroxyl functionality greater than 2.0, obtained from Union Carbide Corp. |
| Polyol 4: | A propylene oxide polyol that has been partially end capped with 15% ethylene oxide to yield a high primary hydroxyl content polyol. It has a hydroxyl number of 28 and a functionality greater than 2.0, obtained from Union Carbide Corp. |
| Surfactant: | A silicone surfactant with the structure |

$$(CH_3)_3SiO \left[ \begin{array}{c} CH_3 \\ | \\ SiO \\ | \\ CH_3 \end{array} \right]_{13} \left[ \begin{array}{c} CH_3 \\ | \\ SiO \\ | \\ CH_2)_3(OC_2H_4)_7OH \end{array} \right]_{5.5} Si(CH_3)_3$$

| | |
|---|---|
| | obtained from Union Carbide Corp. |
| THF: | Tetrahydrofuran |
| THP: | Tetrahydropyran |
| UV: | Ultraviolet |
| Wt. %: | Percent by weight |
| °C. | Temperature, degrees Celsius |
| %: | Percent by weight, unless otherwise designated |
| ≈ | Approximately |
| >  | Greater than |
| < | Less than |

LABORATORY EXPERIMENTAL PROCEDURE

Preparation of 2-Methoxytetrahydropyran

A two-liter hydrogenation reactor was cleaned and dried. Fifty grams of Raney Nickel and 1200 grams of 2-methoxydihydropyran were charged to the reactor and the vapor space was purged with hydrogen. Then, while agitating the system, the temperature was raised to 40° C. and the hydrogen pressure was raised to 1000 psig. This temperature and pressure were maintained until no further hydrogen absorption occurred. The temperature was then slowly increased to 100° C. When the hydrogen uptake ceased at this temperature, the system was cooled to 30° C., carefully vented, and the product was removed. This crude product was refined by distillation using a ten-tray distillation column. The cut (958 grams from a charge of 1130 grams) that was obtained at a kettle temperature of 135° C. and a still head temperature of 128° C. was collected as 2-methoxytetrahydropyran.

Coating and Testing Procedures

In these examples, the coating of test panels consists of a three step procedure. First, a coating composition is prepared by mixing the components well in an amber-colored bottle (to protect against adverse effects of light). The resulting blended composition is then coated onto a Bonderite 37 steel panel using a Number 20 wire-wound rod. The coated panel is then cured using a mercury vapor ultraviolet light source at a predetermined linear rate. At least one pass through the zone of the light source is made.

After the panel has cooled to room temperature (i.e., from about 40°–45° C. to about 25° C.), the coating is tested for tackiness, and for solvent resistance (a measure of the degree of cure) by rubbing the coating with a cheesecloth saturated with acetone. The coating is further tested for various physical properties, using at least one of the test procedures described below.

The procedures used to test coatings cured with the compositions of this invention were as follows:

Solvent Resistance (Double Acetone Rubs)

A measure of the risistance of the cured film to attack by acetone in which a film coating surface was rubbed with an acetone soaked cheesecloth back and forth with hand pressure. A rub back and forth with hand pressure over the film coating surface with the acetone soaked cheesecloth was designated as one "double acetone rub". The effect that a certain number of double acetones rubs had on the film coating surface was reported by a number in parentheses following the number of double acetone rubs. The rating system for evaluating acetone resistance for a given number of double acetone rubs was as follows:

| Number in Parentheses After Number of Rubs | |
|---|---|
| (1) | No change in coating appearance. |
| (2) | Scratched surface. |
| (3) | Dulled, marred, some coating removed. |
| (4) | Breaks in coating appearance. |
| (5) | About one-half of the coating removed. |

Pencil Hardness - ASTMD-3363-74

The rating system for pencil hardness was as follows:

| 6B-5B-4B-3B-2B-B-HB-F-H-2H-3H-4H-5H-6H |
|---|
| Softer                    Harder |

Crosshatch Adhesion

Refers to a test using 10 parallel, single-edged, razor blades to scribe test films with 2 sets of perpendicular lines in a crosshatch pattern. Ratings are based on the amount of film removed after applying an subsequently pulling a contact adhesive tape (Scotch Brand 606) away from the surface of a scribed coating at a 90 degree angle in a fast, rapid movement. It is important to carefully apply and press the tape to the scribed coating to eliminate air bubbles and provide a good bond because adhesion is reported as the percent of film remaining on the substrate, with a 100 percent rating indicating complete adhesion of the film on the substrate.

Reverse or Face Impact Resistance

Measures the ability of a given film to resist rupture from a falling weight. A Gardner Impact Tester using an eight-pound dart is used to test the films cast and cured on the steel panel. The dart is raised to a given height in inches and dropped onto the reverse or face side of a coated metal panel. The inches times pounds, designated inch-pounds, absorbed by the film without rupturing is recorded as the reverse or face impact resistance of the film.

COMPARATIVE EXAMPLE A

This example illustrates the photocuring of 2-methoxytetrahydropyran, using ultraviolet light and a photoinitiator which forms a catalyst.

Nine and six-tenths grams of 2-methoxytetrahydropyran (a clear liquid) and four-tenths gram of Photoinitiator 1 were placed in an amber-colored bottle and mixed well. The blend was then coated onto a Bonderite 37 steel panel with a Number 20 wire-wound rod. The coated panel was then cured with a 100 watt-per-inch, medium-pressure, mercury-vapor diffuse light source (Source 1) at 30 feet per minute (fpm). After one pass under this UV-light source, the coating was still liquid so it was passed twice or more under the light source. After the third pass, the coating was tacky; and, it was noticed that it became darker brown in color with each pass under the light source. After the panel cooled to room temperature (i.e., from about 40°-45° C. to about 25° C.), it still had a tack. The coating was tested for solvent resistance, which is a measure of the degree of cure, by rubbing the coating with a cheesecloth saturated with acetone. The results of this example are presented in Table 1.

TABLE 1

| Time After UV Exposure | Comment | Double Acetone Rubs |
|---|---|---|
| 2 Hours | Light tack | 2(5) |
| 5 Hours | Light tack | 2(5) |
| 3 Days | Tack free | 2(5) |

This example demonstrates that 2-methoxytetrahydropyran alone does respond to a cationic cure mechanism, but the response is sluggish and the product produced is apparently of low molecular weight due to the rapid solubility in acetone. In addition, the dark color formation is not a highly desirable feature for many applications, since clear coatings could not be made and colors would be limited to brown or black.

EXAMPLE 1

This example illustrates the copolymerization of the 2-methoxytetrahydropyran of Example A in admixture with an epoxy compound. The experimental procedure above in Example A was used in this example with the following exceptions:

To five grams of the mixture prepared in Example A, five grams of Epoxy 1 and 3 drops of silicone surfactant were added. These ingredients were mixed and coated onto panels and cured with the UV source as described in Example A at various linear rates. The UV-exposed coatings had the solvent resistance properties presented in Table 2.

TABLE 2

| | Double Acetone Rubs | |
|---|---|---|
| Cure Rate | ~2 Hours After UV Exposure | ~5 Hours After UV Exposure |
| 30 fpm | 100(1) | Not Measured |
| 60 | 100(3) | 100(1) |
| 90 | 54(4) | 100(1) |
| 120 | 35(4) | 100(1) |
| 180 | 25(4) | 100(1) |
| 210 | 33(4) | 100(1) |
| 260 | 30(4) | 100(2) |
| 300 | 35(4) | 100(1) |

At cure rates up to 260 fpm, the coatings were tack free when warm immediately after exposure to the UV source. At 300 fpm, there was a very slight tack to the coating immediately after UV exposure; but, it was tack free 10-15 seconds after UV exposure. Although coatings cured at the higher speeds were not as resistant to solvents when tested two hours after UV exposure, at five hours after exposure, the samples were found to be uniformly resistant. No attempt was made to further increase the cure rate. This system contained approximately 2 percent of Photoinitiator 1.

This example illustrates the startling fact that when combined with Epoxy 1, 2-methoxytetrahydropyran undergoes extremely rapid copolymerization and that the two compounds are synergistic to each other in the curing of these systems.

Other properties of the coatings cured at the various rates are presented in Table 3. The properties were measured 3 days after UV exposure.

TABLE 3

Physical Properties of Coatings Cured at Various Rates, 3 Days After UV Exposure

| Cure Rate | Acetone Double Rubs | Pencil Hardness | Percent Crosshatch Adhesion | Gardner Impact, in. lbs. | |
|---|---|---|---|---|---|
| | | | | Face | Reverse |
| 30 fpm | 100(1) | F | 98 | 25 | <5 |
| 60 | 100(1) | F | 50 | 25 | <5 |
| 90 | 100(1) | H | 97 | 25 | <5 |
| 120 | 100(1) | H | 97 | 25 | <5 |
| 180 | 100(1) | H | 99 | 25 | <5 |
| 210 | 100(1) | H | 99 | 25 | <5 |
| 260 | 100(1) | H | 100 | 25 | <5 |
| 300 | 100(1) | H | 99 | 25 | <5 |

These data show that the physical properties of the coatings cured at linear velocities from 30 to 300 feet per minute are substantially uniform, when tested three days after UV exposure.

EXAMPLES 2-9

These examples demonstrate that various amounts of 2-methoxytetrahydropyran (MTHP) can be blended with Epoxy 1 to produce systems that have unexpectedly high cure rates and that catalyst levels of 0.5 percent or less can be used to cure the systems.

The experimental procedure above in Example A was used in this example with the following exceptions:

The following ingredients (Table 4) were placed in amber-colored bottles, mixed well, and cured with the UV-curing device of Example A (UV Source 1) or a 300 watt/inch focused beam light source that used an A-bulb supplied by Fusion Systems (UV Source 2). The coatings were radiation cured at speeds of 30 fpm to 300 fpm and were found to be tack free either immediately after exposure to the radiation source or within 20 seconds after such exposure.

TABLE 4

| Ingredients, grams | Example | | | | | | | |
|---|---|---|---|---|---|---|---|---|
| | 2 | 3 | 4 | 5 | 6 | 7 | 8 | 9 |
| Methoxytetrahydropyran | 3.92 | 2.9 | 2.0 | 1.0 | 3.96 | 3.98 | 2.9 | 3.92 |
| Epoxy 1 | 5.88 | 6.9 | 7.8 | 8.8 | 5.94 | 5.97 | 6.8 | 5.88 |
| Photoinitiator 1 | 0.20 | 0.20 | 0.20 | 0.20 | 0.10 | 0.05 | — | — |
| Photoinitiator 2 | — | — | — | — | — | — | 0.40 | 0.20 |
| Surfactant | 0.05 | 0.05 | 0.05 | 0.05 | 0.05 | 0.05 | 0.05 | 0.05 |
| % MTHP | 39.2 | 29 | 20 | 10 | 39.6 | 39.8 | 28 | 39.2 |
| % Photoinitiator | 2.0 | 2.0 | 2.0 | 2.0 | 1.0 | 0.5 | 4.0 | 2.0 |

The physical properties of these cured coatings are given in the following Tables 5–7. It is apparent that the degree of crosslinking, as measured by solvent resistance or acetone double rubs, improved with aging in those coatings that have poor initial solvent resistance. This is due to the "dark cure" or cure that continues after exposure to the radiation source.

TABLE 5

Acetone Double Rubs as a Function of Time After Exposure to UV Source 1 at 180 FPM[2]

|  | 2 Hours | 6 Hours | 1 Day | 5 Days |
|---|---|---|---|---|
| Example 2[1] | 100(1) | 100(1) | 100(1) | 100(1) |
| Example 3 | 100(1) | 100(1) | 100(1) | 100(1) |
| Example 4 | 100(1) | 100(1) | 100(1) | 100(1) |
| Example 5 | 100(1) | 100(1) | 100(1) | 100(1) |
| Example 6 | 100(1) | 100(1) | 100(1) | 100(1) |
| Example 7 | 100(1) | 100(1) | 100(1) | 100(1) |
| Example 8 | 14(4) | 20(4) | 25(4) | 70(4) |
| Example 9 | 18(4) | 20(4) | 24(4) | 30(4) |

[1]When the system of Example 2 was cured at 300 fpm (0.6 sec. exposure), identical results were obtained.
[2]Exposure time 1.0 second.

TABLE 6

Acetone Double Rubs as a Function of Time After Exposure to UV Source 2 at 150 FPM[2]

|  | 0.75 Hours | 6 Hours | 1 Day | 5 Days |
|---|---|---|---|---|
| Example 2[1] | 95(3) | 100(1) | 100(1) | 100(1) |
| Example 3 | 100(1) | 100(1) | 100(1) | 100(1) |
| Example 4 | 100(1) | 100(1) | 100(1) | 100(1) |
| Example 5 | 100(1) | 100(1) | 100(1) | 100(1) |
| Example 6 | 65(4) | 100(1) | 100(1) | 100(1) |
| Example 7 | 35(5) | 100(1) | 100(1) | 100(1) |
| Example 8 | 20(4) | 40(4) | 100(1) | 100(1) |
| Example 9 | 10(5) | 15(4) | 25(4) | 70(4) |

[1]Cure speed was 160 fpm for Example 2.
[2]Exposure time 0.25 second.

TABLE 7

Physical Properties of Coatings Cured at 30 FPM[2] With UV Source 1, 5 Days After UV Exposure

| Example | 2 | 3 | 4 | 5 | 6 | 7 | 8 | 9 |
|---|---|---|---|---|---|---|---|---|
| Acetone Double Rubs[1] | 100(1) | 100(1) | 100(1) | 100(1) | 100(1) | 100(1) | 30(5) | 15(5) |
| Pencil Hardness | H | 2H | H | H | H | H | H | H |
| % Crosshatch Adhesion | 0 | 10 | 50 | 98 | 0 | 90 | 100 | 100 |
| Gardner Impact |  |  |  |  |  |  |  |  |
| Face, in. lbs. | <5 | 15 | 15 | 25 | <5 | 15 | 100 | 75 |
| Reverse, in. lbs. | <5 | <5 | <5 | <5 | <5 | <5 | <5 | <5 |

[1]Except for Examples 8 and 9, acetone double rubs were determined one day after UV exposure.
[2]Exposure time 6 seconds.

Examples A and 2 through 9 indicate that MTHP alone responds to UV curing with a photoinitiator present, but the reaction is sluggish. Surprisingly, combinations of MTHP with Epoxy 1 containing from 10 to 50 weight percent MTHP cure very rapidly. These combination systems respond when 0.5 weight percent (or even less) up to 4 weight percent (or even more) of a photoinitiator is present.

Thus, in the examples developed to this point, it has been shown that MTHP alone will respond to UV cure in the presence of a photoinitiator, but the reaction is sluggish; combinations of Epoxy 1 and MTHP that contain from 10 to 50 weight percent MTHP cure very rapidly; the combination systems respond when 0.5 weight percent to 4 weight percent or more photoinitiator is present.

EXAMPLE 10

This example illustrates the performance of a different cycloaliphatic epoxide combined with MTHP and cured with UV light.

The experimental procedure above in Example A was used in this example with the following exceptions:

The following ingredients (Table 8) were placed in amber-colored bottles, mixed well, and coated/cured as described in Example 2 at rates of 30 fpm (6 sec. exposure) and 180 fpm (1 sec. exposure). The coating cured at 30 fpm was tack free immediately after exposure to the UV light source and the coating cured at 180 fpm had a very slight tack immediately after UV exposure but was tack free when it cooled to room temperature.

TABLE 8

| MTHP | 4.9 g. |
|---|---|
| Epoxy 2 | 4.9 g. |
| Photoinitiator 1 | 0.2 g. |
| Surfactant | 0.05 g. |

The coating cured at 30 fpm had an acetone double rub rating of 13(5) one day after UV exposure. Five days after UV exposure, and a pencil hardness of H, 100 percent crosshatch adhesion and >320 in.lbs. face and reverse Gardner impact resistance were noted.

EXAMPLES 11–13, COMPARATIVE EXAMPLES B AND C

These examples indicate that MTHP can be cocured with epoxides and polyols in the presence of a photoinitiator (Examples 11–13). Comparative Examples B and C indicate that mixtures of MTHP and polyols alone do not cure in the presence of a photoinitiator to yield useful coatings, inks, etc.

The following ingredients (Table 9) were placed in amber-colored bottles, mixed well, coated and cured as described in Examples 2–9.

TABLE 9

| Example | 11 | 12 | 13 | B | C |
|---|---|---|---|---|---|
| MTHP, g. | 1.40 | 1.10 | 1.10 | 7.10 | 7.60 |
| Epoxy 1, g. | 6.30 | 6.10 | 6.10 | — | — |
| Polyol 2, g. | 0.90 | — | — | — | — |
| Polyol 3, g. | 0.90 | — | — | — | — |
| Polyol 1, g. | 1.10 | 2.60 | 2.60 | 2.50 | — |
| Polyol 4, g. | — | — | — | — | 2.00 |
| Butyl Cellosolve ®, g. | 0.20 | — | — | — | — |
| Photoinitiator 2, g. | — | — | 0.40 | 0.40 | 0.40 |
| Photoinitiator 1, g. | 0.20 | 0.20 | — | — | — |
| Surfactant, g. | 0.05 | 0.05 | 0.05 | 0.05 | 0.50 |

The coatings of Examples 11-13 were tack free when warm immediately after UV exposure and when cured at a rate of 30 fpm. The coatings of Examples B and C were still liquid in nature—though there had been some increase in viscosity—after three passes under the UV source at 30 fpm, indicating that little if any reaction took place between the cyclic ether and the polyols. The same results were obtained for Examples 11-13 at cure rates of 150 fpm; but at 180 fpm, a very slight tack was noticed. This disappeared and the coatings were tack free when cooled to room temperature. No characteristic properties were determined for Examples B and C.

The properties of the coatings of Examples 11-13 are presented in Tables 10 and 11.

TABLE 10

| | Acetone Double Rubs When Cured at 180 fpm | | | |
|---|---|---|---|---|
| | 2 Hours | 6 Hours | 1 Day | 5 Days |
| Example 11 | 100(1) | 100(1) | 100(1) | 100(1) |
| Example 12 | 100(1) | 100(1) | 100(1) | 100(1) |
| Example 13 | 65(4) | 60(4) | 100(1) | 100(1) |

TABLE 11

| | Properties After 5 Days After 30 fpm Cure (Acetone Rubs 1 Day After) | | |
|---|---|---|---|
| | Example 11 | Example 12 | Example 13 |
| Double Acetone Rubs | 100(1) | 100(1) | 100(1) |
| Pencil Hardness | H | H | H |
| % Crosshatch Adhesion | 50 | 100 | 100 |
| Gardner Impact, in. lbs. | | | |
| Face | 25 | 175 | 225 |
| Reverse | <5 | 125 | 175 |

EXAMPLES 14-17

These examples describe the UV-light curing of tetrahydrofuran

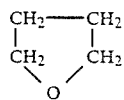

(THF)-containing systems. They exemplify that other cyclic ethers can be used in this invention, including those which are unsubstituted, but that THF does not perform as well as 2-methoxytetrahydropyran.

Compositions containing the following ingredients (Table 12) were mixed, coated, and cured as described in the previous examples.

TABLE 12

| Example | 14 | 15 | 16 | 17 |
|---|---|---|---|---|
| Tetrahydrofuran, g. | 9.6 | 4.8 | 1.9 | 3.5 |
| Epoxy 1 | — | 4.8 | 7.7 | 3.6 |
| Polyol 1, g. | — | — | — | 2.5 |
| Photoinitiator 1, g. | 0.4 | 0.4 | 0.4 | 0.4 |

The coating of Example 14 that contained only THF evaporated from the panel before it could be carried to the UV-curing device. Attempts to put larger amounts on the panel were also unsuccessful, since the THF evaporated for the most part while in the curing device. There was some tacky material on the panel, which indicated that the THF would have given a sluggish cure if it had not evaporated first. The coatings of Examples 15, 16 and 17 were tack free when warm immediately after UV exposure and when cured at 30 fpm. At 60 fpm, the surface of the coatings was tack free when warm, but it could be distorted. When cooled to room temperature (i.e., from ~40°-45° C. to 25° C.), the films were hard and could not be distorted.

The properties of the coatings of Examples 15-17 are presented in Table 13.

TABLE 13

| Physical Properties 1 Day After UV Exposure | | | |
|---|---|---|---|
| | Example 15 | Example 16 | Example 17 |
| Acetone Double Rubs | | | |
| 30 fpm | 100(1)[1] | 100(1)[1] | 35(4) |
| 60 fpm | 100(1)[1] | 100(1)[1] | 35(4) |
| Pencil Hardness | | | |
| 30 fpm | 5H | 5H | F |
| 60 fpm | 5H | 5H | F |
| % Crosshatch Adhesion | | | |
| 30 fpm | 100 | 100 | 100 |
| 60 fpm | 100 | 100 | 100 |
| Gardner Impact, in. lbs. | | | |
| Face, 30 fpm | 50 | 25 | >320 |
| Reverse, 30 fpm | <5 | <5 | >320 |
| Face, 60 fpm | 25 | 25 | >320 |
| Reverse, 60 fpm | <5 | <5 | >320 |

[1]Measured after one hour.

EXAMPLES 18-22

This example illustrates attempts to polymerize tetrahydropyran-2-methanol

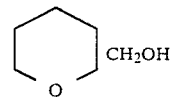

with UV-activated onium salts as a photoinitiator. This compound was obtained from the Aldrich Chemical Company.

The following ingredients (Table 14) were blended and cured as described in Examples 2-9 using UV source 2, operating at a linear rate of 10 fpm (3.6 sec. exposure).

TABLE 14

| Example | 18 | 19 | 20 | 21 | 22 |
|---|---|---|---|---|---|
| Ingredients, grams | | | | | |
| Tetrahydropyran-2-methanol | 9.45 | 9.45 | 4.70 | 2.35 | 7.59 |
| Epoxy 1 | — | — | 4.75 | 7.10 | — |
| Epoxy 3 | — | — | — | — | 1.86 |
| Photoinitiator 1 | 0.50 | — | — | — | — |
| Photoinitiator 2 | — | 0.50 | 0.50 | 0.50 | 0.50 |
| Surfactant | 0.05 | 0.05 | — | — | — |

The coating films of Examples 18 and 19 (without epoxy) were very fluid after three passes under the radiation source, which suggests that little or no polymerization took place. The coating films from Examples 20 and 22 were solid in nature but had a tack, suggesting that cure took place and that the films would have use as an adhesive, such as a pressure sensitive adhesive. The coating film of Example 22 was tack free when warm immediately after UV exposure. The properties of the cured coatings of Examples 20-22 are given below in Table 15.

TABLE 15

Physical Properties 1 Day After UV Exposure

| Example | 20 | 21 | 22 |
|---|---|---|---|
| Acetone Double Rubs | 2(5) | 4(5) | 2(5) |
| Pencil Hardenss | 3B | H | <5B |
| % Crosshatch Adhesion | 100 | 97 | 100 |

The ingredients listed below (Table 16) were well mixed, applied to steel panels and cured as described in Example A, with the following exceptions: Examples 23 to 25 were run with UV source 2 at 10 fpm (3.6 sec. exposure), while Examples 26 to 33 were run with UV Source 2 at 20 fpm (1.8 sec. exposure).

TABLE 16

| Ingredients, g. | 23 | 24 | 25 | 26 | 27 | 28 | 29 | 30 | 31 | 32 | 33 |
|---|---|---|---|---|---|---|---|---|---|---|---|
| Tetra-hydropyran | 9.6 | 4.8 | 1.9 | 3.5 | 2.0 | 4.0 | 2.0 | 4.0 | 2.8 | 4.8 | 2.0 |
| Epoxy 1 | — | 4.8 | 7.7 | 3.6 | — | — | 3.8 | 3.8 | 0.8 | — | 2.0 |
| Polyol 1 | — | — | — | 2.5 | — | — | — | — | — | 4.8 | 2.0 |
| Diglycidyl Ether 1 | — | — | — | — | 7.6 | 5.6 | 3.8 | 1.8 | — | — | 2.0 |
| Diglycidyl Ether 2 | — | — | — | — | — | — | — | — | 2.0 | — | — |
| Vinylcyclohexene Monoepoxide | — | — | — | — | — | — | — | — | 2.0 | — | 1.6 |
| Photoinitiator 1 | 0.4 | 0.4 | 0.4 | 0.4 | 0.4 | 0.4 | 0.4 | 0.4 | 0.4 | 0.4 | 0.4 |
| Surfactant | 0.05 | 0.05 | 0.05 | 0.05 | 0.05 | 0.05 | 0.05 | 0.05 | 0.05 | 0.05 | 0.05 |

These cured systems had the following properties one day after exposure to UV Source 2 at 10 or 20 fpm. No properties are listed for the system of Example 23 because it evaporated before cure was effected.

TABLE 17

| Example | 24 | 25 | 26 | 27 | 28 | 29 | 30 | 31 | 32 | 33 |
|---|---|---|---|---|---|---|---|---|---|---|
| Physical Properties 1 Day After UV Exposure | | | | | | | | | | |
| Double Acetone Rubs | 100 | 100 | 20 | 100 | 70 | 100 | 100 | 20 | 2 | 25 |
| Pencil Hardness | 4H | 4H | 3H | 3H | 4H | 4H | 4H | 3H | F | — |
| % Crosshatch Adhesion | 100 | 100 | 100 | 100 | 100 | 100 | 100 | 100 | 100 | 100 |
| Gardner Impact | | | | | | | | | | |
| Direct, in. lbs. | 25 | 25 | >320 | 100 | 75 | 25 | 25 | 15 | >320 | — |
| Reverse, in. lbs. | <5 | <5 | >320 | 75 | 50 | <5 | <5 | <5 | >320 | — |
| Properties after 10 min. 150° C. Thermal Post Cure | | | | | | | | | | |
| Double Acetone Rubs | 100 | 100 | 100 | 100 | 100 | 100 | 100 | 100 | — | 80 |
| Pencil Hardness | >6H | 5H | 2H | 5H | 5H | 5H | 5H | 5H | — | 4H- |
| % Crosshatch Adhesion | 100 | 100 | 100 | 100 | 100 | 100 | 100 | 100 | 100 | 100 |
| Gardner Impact | | | | | | | | | | |
| Direct, in. lbs. | 25 | 25 | >320 | 50 | 25 | 25 | 25 | >320 | — | >320 |
| Reverse, in. lbs. | <5 | <5 | >320 | 15 | <5 | <5 | <5 | >320 | — | >320 |

EXAMPLES 23-33

These examples illustrate the UV-light curing of reactant blends containing tetrahydropyran, obtained from the Aldrich Chemical Co.

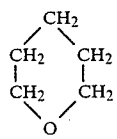

This compound functions well in curing such mixtures, but it does not perform as well as 2-methoxytetrahydropyran. The compound is volatile and has a tendency to evaporate before it cures when used alone or at high levels in coating systems. The systems are slow reacting, since two or three passes at 10-20 fpm were required to effect cure of the systems described below.

The coating of Example 32 was relatively poor in nature and the polyol appeared to have exuded to the surface.

EXAMPLE 34

This example describes the UV light curing of blends that contain tetrahydropyran-2-methanol, obtained from the Aldrich Chemical Co.

The experimental procedure above in Example A was used in this example with the following exceptions:

When this compound was evaluated in combination with a variety of other epoxides and polyols, after three passes under UV Source 2, tacky coatings resulted. When the coatings were thermally postcured for 10 minutes, only one out of fourteen coatings was tack free. Thus, it appears that this compound cures very poorly under the conditions employed.

EXAMPLES 35-37

These examples illustrate the formation of good cured coatings from mixtures of 2-methoxytetrahydropyran with another type of epoxide.

The following ingredients (Table 18) were placed in containers, mixed, cast onto steel panels and cured as described in comparative Example A.

The properties of the cured coatings (Table 18) indicate that high quality coatings were prepared. The coatings of Example 37 provided a very good combination of hardness and impact resistance.

TABLE 18

| Example | 35 | 36 | 37 |
|---|---|---|---|
| Ingredients, g | | | |
| Epoxy 4 | 7.0 | 6.0 | 5.0 |
| MTHP | 3.0 | 3.0 | 3.0 |
| Polyol 1 | — | 1.0 | 2.0 |
| Photoinitiator 1 | 0.2 | 0.2 | 0.2 |
| Surfactant | 0.05 | 0.05 | 0.05 |
| Properties | | | |
| Double Acetone Rubs | >100 | >100 | >100 |
| Pencil Hardness | 2H | 3H | 2H |
| % Crosshatch Adhesion | 100 | 100 | 100 |
| Gardner Impact, in.lbs. | | | |
| Direct | 25 | 25 | >320 |
| Reverse | <5 | <5 | >320 |

EXAMPLES 38-50

To determine the effect of room temperature aging on the shelf life of the very rapid curing coating systems of Examples 1 through 13, the solutions (coating formulations) were allowed to age from Mar. 8, 1983, when they were prepared for Examples 1-11, B and C, until Mar. 19, 1984. On this latter date, these coating solutions (except for Example 12, of which none remained) were again cast onto Bonderite 37 steel panels and cured at various rates with the UV Source 1. The results are presented in Table 19.

TABLE 19

| | Physical Properties of Coatings Aged One Year Before UV Curing | | | | | | | | | | | | |
|---|---|---|---|---|---|---|---|---|---|---|---|---|---|
| Example | 38 | 39 | 40 | 41 | 42 | 43 | 44 | 45 | 46 | 47 | 48 | 49 | 50 |
| Previous Ex. No. | 1 | 2 | 3 | 4 | 5 | 6 | 7 | 8 | 9 | 10 | 11 | B | C |
| Cure Speed, fpm | 150 | 300 | 150 | 150 | 150 | 150 | 150 | 100 | 150 | 150 | 150 | 30 | 30 |
| Exposure sec. | 1.2 | 0.6 | 1.2 | 1.2 | 1.2 | 1.2 | 1.2 | 1.8 | 1.2 | 1.2 | 1.2 | 6.0 | 6.0 |
| Double Acetone Rubs | >100 | >100 | >100 | >100 | >100 | >100 | >100 | 60 | 12 | >100 | 70 | 2 | 2 |
| Pencil Hardness | 2H | 2H | 2H | 2H | H | 2H | 2H | H | H | 2H | 2H | — | — |
| % Crosshatch Adhesion | 100 | 100 | 100 | 100 | 97 | 100 | 100 | 100 | 100 | 100 | 100 | — | — |
| Gardner Impact | | | | | | | | | | | | | |
| Direct | 25 | 25 | 25 | 25 | 25 | 15 | 25 | 25 | >320 | >320 | >320 | — | — |
| Reverse | <5 | <5 | <5 | <5 | <5 | <5 | <5 | <5 | >320 | 150 | 300 | — | — |

From these results, it is readily apparent that the properties of coatings obtained from these systems are essentially the same as those from the systems cured over a year earlier. This is particularly significant in that very rapidly reacting systems, such as these 100% solids mixtures, can have short shelf lives. However, these systems remained active and yielded good properties over one year after their preparation when stored in the absence of ultraviolet light.

EXAMPLE 51

This example illustrates the radiation curing of mixtures of cycloaliphatic ethers and cycloaliphatic epoxides containing relatively small amounts of the cycloaliphatic ether. The experimental procedure above in Example A was used in this example with the following exceptions.

The ingredients of the mixture were 9.9 g. Epoxy 1, 0.10 g. MTHP, 0.4 g. photoinitiator 1 and 0.05 g. Surfactant, with MTHP present as approximately 0.96 percent of the total composition or 1.0 percent based upon the MTHP and epoxide alone.

The coating was cured by passing it under UV Source 2 at a rate of 10 feet per minute (approximately 3.8 seconds exposure). The cured panel was tack free when warm, immediately after ultraviolet light exposure. Twenty-four hours after exposure, the coating passed 100 acetone double rubs, had no crosshatch adhesion, had a pencil hardness of 2H, and an impact resistance of 25 in-lb when directly impacted and of less than five in-lbs when subjected to reverse impact. Nine days after UV exposure, the crosshatch adhesion had improved to 75 percent with no change in hardness. Thus, even very small proportions of the cycloaliphatic ether can produce mixtures which cure well, albeit at slower rates.

EXAMPLES 52-55

The experimental procedure above in Example A was used in this example with the following exceptions.

The ingredients shown in Table 20 were mixed, cast and cured by exposure to UV Source 2 at a rate of 10 feet per minute. (3.8 seconds exposure).

TABLE 20

| Example | 52 | 53 | 54 | 55 |
|---|---|---|---|---|
| Ingredients, g. | | | | |
| MTHP | 6.00 | 7.00 | 8.00 | 9.00 |
| Epoxy 1 | 4.00 | 3.00 | 2.00 | 1.00 |
| Photoinitiator 1 | 0.40 | 0.40 | 0.40 | 0.40 |
| Surfactant | 0.05 | 0.05 | 0.05 | 0.05 |

TABLE 20-continued

| Example | 52 | 53 | 54 | 55 |
|---|---|---|---|---|
| Percent MTHP | 57.4 | 67.0 | 76.6 | 86.1 |

The exposed coatings of Examples 52 and 53 were tack free when warm immediately after UV exposure. The exposed coatings of Examples 54 and 55 were tacky when warm immediately after UV exposure. It was apparent that there had been some evaporation of coating from the system of Example 55 after UV exposure. When the coatings of Examples 54 and 55 were examined 24 hours after UV exposure, they were tack free.

The cured coatings of these examples had the following physical characteristics (Table 21) when they were determined 24 hours after UV exposure.

TABLE 21

| Properties Of Coatings Cured With UV Source 2 At 10 fpm, One Day After Exposure | | | | |
|---|---|---|---|---|
| Example | 52 | 53 | 54 | 55 |
| Double Acetone Rubs[1] | 15 | 7 | 4 | 2 |
| Pencil Hardness | F | B | 3B | 2H |
| % Crosshatch Adhesion | 100 | 100 | 100 | 100 |
| Gardner Impact | | | | |
| Direct, in-lbs | 75 | 75 | 75 | 75 |
| Reverse, in-lbs | 15 | <15 | <15 | <15 |

[1]These values represent the point at which about one-half of the coating was removed.

These data indicate that the mixtures cure more slowly as the proportions of MTHP are increased above about 75 percent of the total composition, and based upon the relatively low number of double acetone rubs attained, these coatings have less solvent resistance. While not wishing to be bound by theory, it is presently believed that this may be due to the formation of structures which are less crosslinked or more linear as the proportions of MTHP increase.

Certain properties were again examined nine days after the exposure to ultaviolet light. The double acetone rubs did not change. The hardness values were as shown in Table 22.

TABLE 22

| Example 52 | 2H |
|---|---|
| Example 53 | HB |
| Example 54 | H |
| Example 55 | 4H |

Thus, the hardness increased with the passage of time. Since the acetone resistance did not change, it is strongly suggested that the ingredients had further polymerized in a linear or non-crosslinked manner as time passed.

EXAMPLES 56–58

The experimental procedure above in Example A was used in these examples with the following exceptions.

The ingredients shown in Table 23 were mixed, cast, and cured by exposure to UV Source 2 at a rate of 10 feet per minute (3.8 seconds exposure).

TABLE 23

| Example | 56 | 57 | 58 |
|---|---|---|---|
| Ingredients, g. | | | |
| MTHP | 4.75 | 4.75 | 3.75 |
| Epoxy 1 | 4.56 | 4.56 | 4.26 |

TABLE 23-continued

| Example | 56 | 57 | 58 |
|---|---|---|---|
| 1,2-epoxydodecene | 0.24 | 0.24 | 0.14 |
| Triethylene glycol | — | — | 0.14 |
| Polyol 2 | — | — | 0.65 |
| Polyol 3 | — | — | 0.61 |
| Photoinitiator 1 | — | 0.40 | — |
| Photoinitiator 2 | 0.40 | — | 0.40 |
| Surfactant | 0.05 | 0.05 | 0.05 |

The exposed coatings of Examples 56–58 were tack free when warm immediately after UV exposure. the cured coatings of these examples had the following physical characteristics (Table 24) when they were determined 24 hours after UV exposure.

TABLE 24

| Properties Of Coatings Cured With UV Source 2 At 10 fm, One Day After Exposure | | | |
|---|---|---|---|
| Example | 56 | 57 | 58 |
| Double Acetone Rubs | 65(4) | 100(2) | 100(3) |
| Pencil Hardness | 4H | 2H | 2H |
| % Crosshatch Adhesion | 75 | 98 | 100 |
| Gardner Impact | | | |
| Direct, in-lbs | 25 | 25 | >320 |
| Reverse, in-lbs | <5 | <5 | >320 |

The above examples illustrate that combinations of cycloaliphatic ethers and cycloaliphatic epoxides cure rapidly and effectively in the presence of a photoninitiator and ultraviolet light. The use of these components in coating systems, which can optionally contain other polymerizable components, permits much higher line speeds in coating processes and/or the use of reduced quantities of the costly photoinitiator. It is necessary to optimize a system for its end use by varying the amounts of the components in the system. The results of the above examples do not represent optimized coating systems, but are intended only to illustrate that the curing rate and amount of photoinitiator required can be varied by using various proportions of these components. Thus, the scope of the present invention is limited only by the appended claims.

What is claimed is:

1. A photopolymerizable composition consisting essentially of 2-methoxytetrahydropyran, the diepoxide, 3,4-epoxycyclohexylmethyl-3,4-epoxycyclohexane carboxylate and an aryl sulfonium salt photoinitiator wherein the amount of 2-methoxytetrahydropyran present in said composition is about 5 to about 70 weight percent, based on the combined weight of said pyran and said diepoxide.

2. A photopolymerizable composition as defined in claim 1 wherein the amount of 2-methoxytetrahydropyran is about 10 to about 50 weight percent.

3. A photopolymerizable composition as defined in claim 1 wherein the amount of 2-methoxytetrahydropyran is about 15 to about 45 weight percent.

4. A photopolymerizable composition as defined in claim 1 wherein the photoinitiator is a polyarylsulfonium hexafluoroantimony salt.

5. The photocured product of the composition defined in claim 1.

6. A photopolymerizable composition consisting essentially of 2-methoxytetrahydropyran, the diepoxide, 3,4-epoxycyclohexylmethyl-3,4-epoxycyclohexane carboxylate, an aryl sulfonium salt photoinitiator and a polyol wherein the amount of 2-methoxytetrahydropryan present in said composition is about 5 to about 70 weight percent, based on the combined weight of said pyran and said diepoxide.

7. A photopolymerizable composition as defined in claim 6 wherein the polyol is a polylactone polyol.

8. A photopolymerizable composition as defined in claim 6 wherein the polylactone polyol is a polycaprolactone polyol.

9. A photopolymerizable composition as defined in claim 6 wherein the polyol is a polyether polyol.

10. A photopolymerizable composition as defined in claim 9 wherein the polyether polyol is polypropylene oxide polyol.

* * * * *